(12) United States Patent
Beard et al.

(10) Patent No.: US 12,289,941 B2
(45) Date of Patent: Apr. 29, 2025

(54) CHIRAL HETEROSTRUCTURES

(71) Applicant: Alliance for Sustainable Energy, LLC, Golden, CO (US)

(72) Inventors: Matthew Craig Beard, Arvada, CO (US); Jeffrey Lee Blackburn, Golden, CO (US); Ji Hao, Santa Clara, CA (US); Haipeng Lu, Hong Kong (CN)

(73) Assignee: Alliance for Sustainable Energy, LLC, Golden, CO (US)

( * ) Notice: Subject to any disclaimer, the term of this patent is extended or adjusted under 35 U.S.C. 154(b) by 495 days.

(21) Appl. No.: 17/653,470

(22) Filed: Mar. 4, 2022

(65) Prior Publication Data
US 2022/0326082 A1    Oct. 13, 2022

Related U.S. Application Data

(60) Provisional application No. 63/163,809, filed on Mar. 20, 2021.

(51) Int. Cl.
| | |
|---|---|
| *G01J 4/04* | (2006.01) |
| *H01L 51/00* | (2006.01) |
| *H10K 30/20* | (2023.01) |
| *H10K 85/10* | (2023.01) |
| *H10K 85/20* | (2023.01) |
| *H10K 85/30* | (2023.01) |
| *H10K 30/50* | (2023.01) |

(52) U.S. Cl.
CPC .............. *H10K 30/20* (2023.02); *G01J 4/04* (2013.01); *H10K 85/111* (2023.02); *H10K 85/221* (2023.02); *H10K 85/371* (2023.02); *H10K 30/50* (2023.02)

(58) Field of Classification Search
CPC ............ H01L 51/0035; H01L 51/0048; H01L 51/0091; H01L 51/424; G01J 4/04
See application file for complete search history.

(56) References Cited

U.S. PATENT DOCUMENTS

2022/0002619 A1    1/2022   Luther et al.

OTHER PUBLICATIONS

Assila Maatar Ben Salah, Nadhem Sayari, Houcine Naili and Alexander. J. Norquist, Chiral and achiral copper(II) complexes: structure, bonding and biological activities, RSC Adv., 2016, 6, 59055-59065 (Year: 2016).*

Hyun Suk Kang, Thomas J. Sisto, Samuel Peurifoy, Dylan H. Arias, Boyuan Zhang, and Jeffrey L. Blackburn, Long-Lived Charge Separation at Heterojunctions between Semiconducting Single-Walled Carbon Nanotubes and Perylene Diimide Electron Acceptors, J. Phys. Chem. C 2018, 122, 14150-14161 (Year: 2018).*

Ji Hao, Haipeng Lu, Lingling Mao, Xihan Chen, Matthew C. Beard, and Jeffrey L. Blackburn, Direct Detection of Circularly Polarized Light Using Chiral Copper Chloride-Carbon Nanotube Heterostructures,ACS Nano 2021 15 (4), 7608-7617 (Year: 2021).*

(Continued)

*Primary Examiner* — Bijan Ahvazi
(74) *Attorney, Agent, or Firm* — Michael A. McIntyre

(57) ABSTRACT

The present disclosure relates to a composition that includes a first layer having a first molecule that includes a metal and a halogen, a second layer that includes the first molecule, and a third layer that includes a chiral molecule, where the third layer is positioned between the first layer and the second layer, and the first layer, the second layer, and the third layer form a crystalline structure.

16 Claims, 26 Drawing Sheets

(56) References Cited

OTHER PUBLICATIONS

Abendroth, J.M. et al., "Spin Selecxtivity in Photoinduced Charge-Transfer Mediated by Chiral Molecules," ACS Nano, vol. 13, 2019, 19 pages.

Ahn, J. et al., "Chiral 2D Organic Inorganic Hybrid Perovskite with Circular Dichroism Tunable Over Wide Wavelength Range," Journal of the American Chemical Society, vol. 142, 2020, 7 pages.

Ben Salah, A.M. et al., "Chiral and achiral copper(II) complexes: structure, bonding and biological activities," RSC Advances, vol. 6, 2016, 11 pages.

Chen, C. et al., "Circularly polarized light detection using chiral hybrid perovskite," Nature Communications, vol. 10, 2019, 7 pages.

Ferguson, A.J. et al., "Efficiency of Charge-Transfer Doping in Organic Semiconductors Probed with Quantitative Microwave and Direct-Current Conductance," Journal of Physical Chemistry Letters, vol. 9, 2018, 7 pages.

Ihly, R. et al., "Efficient charge extraction and slow recombination in organic-inorganic perovskites capped with semiconducting single-walled carbon nanotubes," Energy & Environmental Science, vol. 9, 2016, 11 pages.

Ishii, A. et al., "Direct detection of circular polarized light in helical 1D perovskite-based photodiode," Science Advances, vol. 6, Nov. 11, 2020, 6 pages.

Jana, M.K. et al., "Organic-to-inorganic structural chirality transfer in a 2D hybrid perovskite and impact on Rashba-Dresselhaus spin-orbit coupling," Nature Communications, vol. 11, 2020, 10 pages.

Kang, H.S. et al., "Long-Lived Charge Separation at Heterojunctions between Semiconducting Single-Walled Carbon Nanotubes and Perylene Diimide Electron Acceptors," Journal of Physical Chemistry C, vol. 122, 2018, 12 pages.

Kim, N.Y. et al., "Chrioptical-Conjugated Polymer/Chiral Small Molecule Hybrid Thin Films for Circularly Polarized Light-Detecting Heterojunction Devices," Davanced Functional Materials, vol. 29, 2019, 10 pages.

Long, G. et al., Chiral-perovskite optoelectronics, Nature Reviews, vol. 5, Jun. 2020, 7 pages.

Low, S. et al., "Reactions of Copper(II) Chloride in Solution: Facile Formation of Tetranuclear Copper Clusters and Other Complexes That Are Relevant in Catalytic Redox Processes," ChemPubSoc Europe, vol. 19, 2013, 10 pages.

Lu, H. et al., "Spin-dependent charge transport through 2D chiral hybrid lead-iodide perovskites," Science Advances, vol. 5, 2019, Dec. 6, 2019, 8 pages.

Lu, H. et al., "Highly Distorted Chiral Two-Dimensional Tin Iodide Perovskites for Spin Polarized Charge Transport," Journal of the American Chemical Society, vol. 142, 2020, 11 pages.

Ma, J. et al., "Chiral 2D Perovskites with a High Degree of Circularly Polarized Photoluminescence," ACS Nano, vol. 13, 2019, 7 pages.

Polyakov, A.O. et al., "Coexisting Ferromagnetic and Ferroelectric Order in a CuCl4-based Organic-Inorganic Hybrid," Chemistry of Materials, vol. 24, 2012, 7 pages.

Shang, X. et al., "Surface-Doped Quasi-2D Chiral Organic Single Crystals for Chiroptical Sensing," ACS Nano, vol. 14, 2020, 11 pages.

Sulas-Kern, D.B. et al., "Microsecond charge separation at heterojunctions between transition metal dichalcogenide monoilayers and single-walled carbon nanotubes," RSC Materials Horizons, vol. 6, 2019, 9 pages.

Wang, L. et al., "A Chiral Reduced-Dimension Perovskite for an Efficient Flexible Circularly Polarized Light Photodetector," Angewandte Chemie, vol. 132, 2020, 9 pages.

Wang, J. et al., "Spin-Dependent Photovoltaic and Photogalvanic Responses of Optoelectronic Devices Based on Chiral Two-Dimensional Hybrid Organic-Inorganic Perovskites," ACS Nano, vol. 15, 2021, 8 pages.

Xie, C. et al., "Perovskite-Based Phototransistors and Hybrid Photodetectors," Advanced Functional Materials, vol. 30, 2020, 28 pages.

Yang, Y. et al., "Circularly polarized light detection by a chiral organic semiconductor transistor," Nature Photonics, vol. 7, Aug. 2013, 5 pages.

Li, Z. et al., "π-Extended perylene diimmide double-heterohelicenes as ambipolar organic semiconductors for broadband circularly polarized light detection," Nature Communications, vol. 12, 2021, 9 pages.

\* cited by examiner

CHIRAL HETEROSTRUCTURES

This application claims priority from U.S. Provisional Patent Application No. 63/163,809 filed on Mar. 20, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Detection of circularly polarized light (CPL) is of great importance for the development of various optical technologies, including optical imaging, remote sensing, quantum computing, and information processing and communication. However, conventional optical detectors require coupling with optical polarizers to detect CPL, which often limits their sensitivity and resolution. In contrast, direct detection of the polarization state of CPL can be achieved in chiral systems that display circular dichroism (CD), i.e., distinct absorption coefficients for left- and right-handed CPL. However, current CPL detectors utilizing chiral absorbers fail to effectively transduce an optical CD into a sufficiently large electrical signal and tend to amplify the discrimination (anisotropy factor) between the different photon helicities. Thus, there remains a need for improved chiral absorber materials to enable the development of a variety of optical technologies, including detectors.

SUMMARY

An aspect of the present disclosure is a composition that includes a first layer having a first molecule that includes a metal and a halogen, a second layer that includes the first molecule, and a third layer that includes a chiral molecule, where the third layer is positioned between the first layer and the second layer, and the first layer, the second layer, and the third layer form a crystalline structure. In some embodiments of the present disclosure, the metal may include copper. In some embodiments of the present disclosure, the halogen may include chloride. In some embodiments of the present disclosure, the first molecule may include $CuCl_4$. In some embodiments of the present disclosure, the crystalline structure may have a shape like a platelet.

In some embodiments of the present disclosure, the chiral molecule may include a first functional group that includes at least one of an amine group, an ammonium group, a sulfate group, a phosphate group, a carboxylate group, an alkyl halide, a sulfuric acid group, a phosphoric acid group, and/or a carboxylic acid group. In some embodiments of the present disclosure, the chiral molecule may further include a second group that includes a hydrocarbon having between 3 and 30 carbon atoms. In some embodiments of the present disclosure, the hydrocarbon may include at least one of a straight chained functional group, a branched functional group, and/or a ringed functional group. In some embodiments of the present disclosure, the hydrocarbon may be saturated. In some embodiments of the present disclosure, the hydrocarbon may be unsaturated. In some embodiments of the present disclosure, the hydrocarbon may include an aromatic ring. In some embodiments of the present disclosure, the aromatic ring may include benzene.

In some embodiments of the present disclosure, the chiral molecule may include at least one of an amino acid (R)-2-octylamine, (S)-2-octylamine, R-methylbenzylammonium, 5-methylbenzyleammonium, R-cysteine, S-cysteine, L-Canavanine, L-Canavanine sulfate salt, L-Leucine, L-proline, N-Acetyl-D-penicillamine, L-Cysteine hydrochloride monohydrate, (R)-(−)-sec-Butylamine, (S)-(+)-sec-Butylamine, (R)-(−)-2-Amino-3-methylbutane, (S)-(+)-2-Amino-3-methylbutane, (S)-(+)-3,3-Dimethyl-2-butylamine, (R)-(−)-3,3-Dimethyl-2-butylamine, (S)-(+)-1-Cyclohexylethylamine, (R)-(−)-1-Cyclohexylethylamine, R-ethylbenzylamine, S-ethylbenzylamine, sulfobetaine, phosphocholine, (S)-(−)-1-(1-Naphthyl)ethylamine, (S)-(+)-1,2,3,4-Tetrahydro-1-naphthylamine, (S)-1,2,3,4-Tetrahydro-3-isoquinolinecarboxylic acid, (S)-(+)-3-Amino-1-Boc-piperidine, (S)-(−)-1-(4-Bromophenyl)ethylamine, (S)-(+)-1-Aminoindan, (S)-1-Cyclopropylethylamine, (S)-(−)-3-Cyclohexene-1-carboxylic acid, (S)-(−)-1-(2-Naphthyl)ethylamine, (S)-1-(2-fluorophenyl)ethylamine, (S)-(−)-1-Amino-2-(methoxymethyl)pyrrolidine, (R)-(+)-Bornylamine, (S)-1-m-Tolylethanamine, (S)-(+)-1-Methoxy-2-propylamine, (S)-(+)-1-methyl-3-phenylpropylamine, (S)-(+)-1-Amino-2-propanol, (S)-1,4-benzodioxane-2-carboxylic acid, (S)-1,2,3,4-Tetrahydro-1-naphthoic acid, (R)-1,2,3,4-Tetrahydro-1-naphthoic acid, (R)-(−)-1,2,3,4-Tetrahydro-1-naphthylamine, (R)-(+)-1,2-Dithiolane-3-pentanoic acid, (S)-1-Boc-4-oxopiperidine-2-carboxylic acid, penicillamine, glutathione, oligopeptide, and/or L-Cystathionine.

In some embodiments of the present disclosure, the composition may further include a transport layer that includes a carbon nanotube. In some embodiments of the present disclosure, the carbon nanotube may be a single-walled carbon nanotube (SWCNT). In some embodiments of the present disclosure, the SWCNT may include a (6,5) semiconducting SWCNT. In some embodiments of the present disclosure, the composition may be capable of detecting circularly polarized light (CPL). In some embodiments of the present disclosure, the CPL may have an average anisotropic factor of circular dichroism ($g_{CD}$) between about 0.001 and about 0.2 in a wavelength range between about 200 nm and about 470 nm. In some embodiments of the present disclosure, the composition may further include an average anisotropic factor of photoresponsivity ($g_{res}$) between about −0.194 and about +0.25.

An aspect of the present disclosure is a device that includes an absorber layer that includes a first layer that includes a first molecule that includes a metal and a halogen, a second layer that includes the first molecule, and a third layer that includes a chiral molecule, where the third layer is positioned between the first layer and the second layer, and the first layer, the second layer, and the third layer form a crystalline structure. The device also includes a transport layer that includes a carbon nanotube and the device is capable of detecting circularly polarized light (CPL). In some embodiments of the present disclosure, the device may be configured to operate as at least one of an optical device, an imaging device, a sensing device, a computing device, an information processing device, and/or a communication device.

BRIEF DESCRIPTION OF DRAWINGS

Some embodiments are illustrated in referenced figures of the drawings. It is intended that the embodiments and figures disclosed herein are to be considered illustrative rather than limiting.

Figure 1:
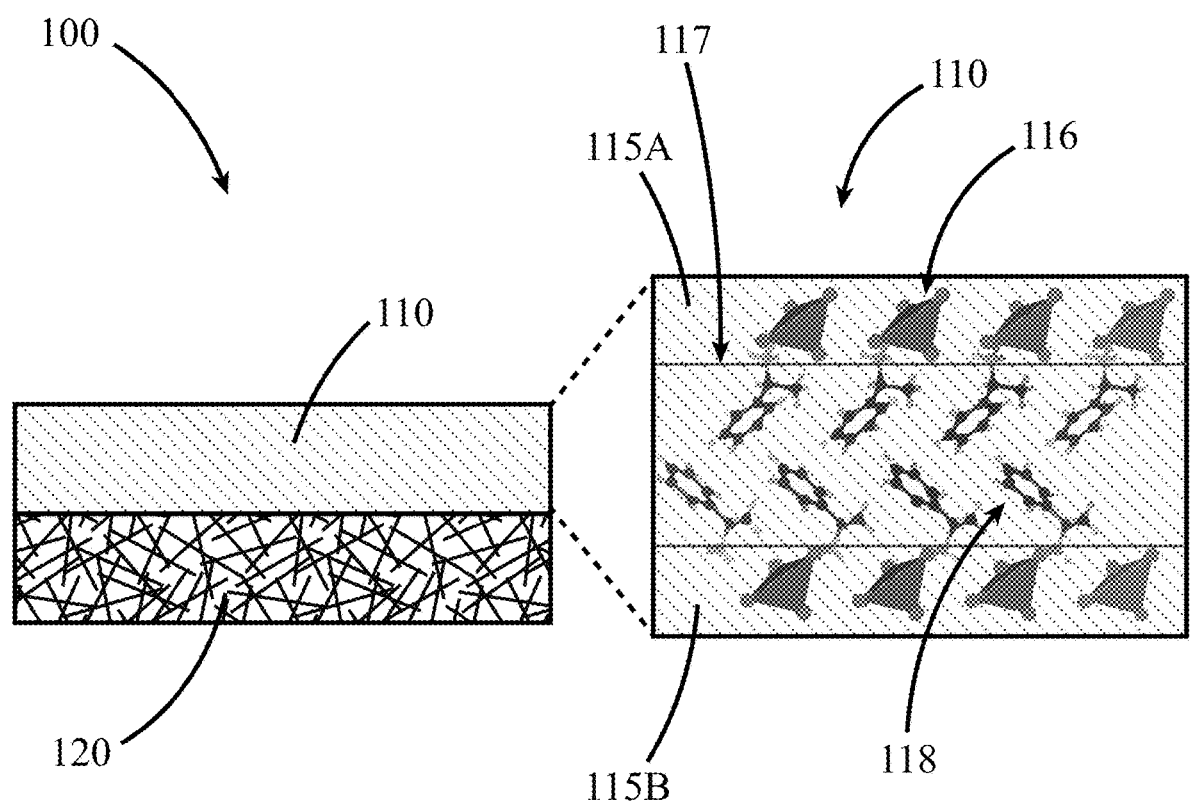
FIG. 1 illustrates a composition, according to some embodiments of the present disclosure.

REFERENCE NUMERALS 100 composition
110 absorber layer
115A first layer
115B second layer
116 first molecule
117 third layer
118 chiral molecule
120 transport layer

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to, among other things, heterostructures capable of detecting circularly polarized light (CPL). For example, described herein is the synthesis of zero-dimensional (OD) copper chloride tetrahedra, that when combined with chiral methylbenzylammonium (R/S-MBA), i.e., (R-/S-MBA)$_2$CuCl$_4$, display circular dichroism. Further, this chiral absorber is combined with a thin-film network of semiconducting single-walled carbon nanotube (s-SWCNT), resulting in a heterojunction between the chiral (MBA)$_2$CuCl$_4$ absorber layer and the s-SWCNT transport layer. As shown below, these chiral heterostructures result in a high photoresponsivity of 452 A/W, an average anisotropy factor ($g_{res}$) of 0.21, a competitive $g_{res}$ of up to 0.25, a current response in microamperes, and a working voltage as low as 0.01V. These results clearly demonstrate a useful strategy towards high-performance chiral optoelectronic devices, where a nanoscale heterostructure enables direct CPL detection even for highly insulating chiral materials.

FIG. 1 illustrates a composition 100 capable of circularly polarized light (CPL) and/or capable of absorbing CPL, that includes an absorber layer 110 positioned on a transport layer 120, according to some embodiments of the present disclosure. As shown herein, the absorber layer 110 may include a chiral layer constructed of a plurality of a chiral molecule 118 (e.g., R/S-MBA) positioned between two layers, a first layer 115A and a second layer 115B, each constructed of a plurality of a first molecule 116 (i.e., metal-containing molecule; e.g., CuCl$_4$). MBA is a cation with a positive charge (MBA$^+$), whereas CuCl$_4$ is an anion having two negative charges ([CuCl$_4$]$^{-2}$), which together form charge-balanced (MBA)$_2$CuCl$_4$. The chiral layer positioned between the first layer 115A and second layer 115B is referred to herein as a third layer 117. As described below in more detail, the combination of the third layer 117 positioned between the first layer 115A and second layer 115B constructed of first molecules 116 results in the forming of a crystalline structure, e.g., (R-/S-MBA)$_2$CuCl$_4$, the absorber layer 110, which is capable of absorbing circularly polarized light such that the resultant electrons are rapidly transferred to the transport layer 120, e.g., a layer of s-SWCNTs.

In some embodiments of the present disclosure, a first molecule 116 may include at least one of CuCl$_4$. In general, the first molecule 116 may contain any of a variety of metal halide moieties (PbI$_4$, Pb$_2$I$_6$, SnI$_4$, Sn$_2$I$_6$, etc.) and any of a variety of chiral cations (methyl benzyl ammonium (R- or S-MBA), β-methylphenethlammonium (R- or S-MPEA), 2-butylammonium (R- or S-BA), or 2-hexylamine (R- or S-HA) (see full list below). For example, in some embodiments of the present disclosure, an absorber layer 110 may include at least one of (MBA/FEA)$_2$PbI$_4$, (MBA/FEA)$_2$SnI$_4$, (MBA/FEA)$_2$PbCl$_4$, and/or (MBA)$_2$PbBr$_4$, wherein MBA is chiral; e.g., either R- or S-MBA.

In some embodiments of the present disclosure, a chiral molecule 118 may include a first functional group, such as at least one of an amine group, an ammonium group, a sulfate group, a phosphate group, a carboxylate group, an alkyl halide, a sulfuric acid group, a phosphoric acid group, and/or a carboxylic acid group. A first functional group of a chiral molecule 118 may be bonded to a second functional group composed of a hydrocarbon having between 3 and 30 carbon atoms, where the hydrocarbon may include at least one of a straight chained functional group, a branched functional group, or a ringed functional group. In some embodiments of the present disclosure, a hydrocarbon functional group of a chiral molecule 118 may be a saturated or unsaturated hydrocarbon. A hydrocarbon functional group of a chiral molecule 118 may be an aromatic ring, such as benzene.

In some embodiments of the present disclosure, a chiral molecule 118 may include at least one of an amino acid (R)-2-octylamine, (S)-2-octylamine, R-methylbenzylammonium, S-methylbenzylammonium, R-cysteine, S-cysteine, L-canavanine, L-canavanine sulfate salt, L-leucine, L-proline, N-acetyl-D-penicillamine, L-cysteine hydrochloride monohydrate, (R)-(−)-sec-butylamine, (S)-(+)-sec-butylamine, (R)-(−)-2-amino-3-methylbutane, (S)-(+)-2-amino-3-methylbutane, (S)-(+)-3,3-dimethyl-2-butylamine, (R)-(−)-3,3-dimethyl-2-butylamine, (S)-(+)-1-cyclohexylethylamine, (R)-(−)-1-cyclohexylethylamine, R-ethylbenzylamine, S-ethylbenzylamine, sulfobetaine, phosphocholine, (S)-(−)-1-(1-naphthyl)ethylamine, (S)-(+)-1,2,3,4-tetrahydro-1-naphthylamine, (S)-1,2,3,4-tetrahydro-3-isoquinolinecarboxylic acid, (S)-(+)-3-amino-1-Boc-piperidine, (S)-(−)-1-(4-bromophenyl)ethylamine, (S)-(+)-1-aminoindan, (S)-1-cyclopropylethylamine, (S)-(−)-3-cyclohexene-1-carboxylic acid, (S)-(−)-1-(2-naphthyl) ethylamine, (S)-1-(2-fluorophenyl)ethylamine, (S)-(−)-1-amino-2-(methoxymethyl)pyrrolidine, (R)-(+)-bornylamine, (S)-1-m-tolylethanamine, (S)-(+)-1-methoxy-2-propylamine, (S)-(+)-1-methyl-3-phenylpropylamine, (S)-(+)-1-amino-2-propanol, (S)-1,4-benzodioxane-2-carboxylic acid, (S)-1,2,3,4-tetrahydro-1-naphthoic acid, (R)-1,2,3,4-tetrahydro-1-naphthoic acid, (R)-(−)-1,2,3,4-tetrahydro-1-naphthylamine, (R)-(+)-1,2-dithiolane-3-pentanoic acid, (S)-1-boc-4-oxopiperidine-2-carboxylic acid, penicillamine, glutathione, oligopeptide, and/or L-cystathionine. In some embodiments of the present disclosure, a chiral molecule may be a zwitterion.

In some embodiments of the present disclosure, a crystalline structure absorber layer 110 made of the combination of a third layer 117 positioned between the first layer 115A and the second layer 115B constructed of first molecules 116 may have a significantly planar shape, i.e., the shape of a two-dimensional (2D) platelet or a one-dimensional (1D) nanowire. In 2D nanostructures, the layers (115A and/or 115B) constructed of first molecules 116 (e.g., metal halide sheets) can have the thickness of one lead halide octahedron, where a third layer 117 constructed of chiral molecules 118 separates each 2D platelet and the total thickness can encompass anything equal to or greater than one layer (one layer=one 2D layer of metal halide octahedra sandwiched by two layers (i.e., third layer 117 of chiral molecules). 1D nanowires can consist of one-dimensional face-sharing, corner-sharing, or face- and corner-sharing metal halide octahedra that are surrounded by chiral cations, where the nanowire can be any length. In some embodiments of the present disclosure, an absorber layer 110 may have a total thickness between about 10 nm and about 200 nm, or between about 10 nm and about 100 nm. In some embodiments of the present disclosure, a third layer 117 may be constructed of one or more layers (not shown) of chiral molecules 118, where each layer is approximately the thickness of a characteristic length of the chiral molecule 118, corresponding to a thickness between about 1 nm and about 5 nm per layer. In some embodiments of the present disclosure, at least one of a first layer 115A and/or a second layer 115B may be constructed of one or more layers (not shown) of first molecules 116, where each layer is approximately the thickness of a characteristic length of the first molecule 116, corresponding to a thickness between about 1 nm and about 2 nm per layer.

Referring again to FIG. 1, the exemplary composition 100 includes an absorber layer 110, as described above, in contact with a transport layer 120. In some embodiments of the present disclosure, a transport layer 120 may be constructed of an electrically conductive material, with examples including a conductive carbonaceous material. Examples of a carbonaceous material suitable for use as a transport layer 120 include carbon nanotubes, fullerenes, graphene, graphite, and/or graphene oxide. Carbon nanotubes include SWCNTs and multi-walled carbon nanotubes (MWCNTs). Examples of SWCNTs include (6,5) semiconducting SWCNT and/or multi-chiral SWCNT. In some embodiments of the present disclosure, an absorber layer 120 may have a thickness between about 10 nm and about 1500 nm.

In some embodiments of the present disclosure, a composition 100 like that shown in FIG. 1, may be characterized by a CPL with an average anisotropic factor ($g_{CD}$) between about 0.001 and about 0.2 in a wavelength range between about 200 nm and about 470 nm. And the average anisotropic factor of photoresponsivity ($g_{res}$) of claim 1 devices (S and R chiral $MBA_2CuCl_4$/SWCNT heterojunctions) are about −0.194 and +0.21, respectively, and devices have been prepared with $g_{res}$ (R chiral $MBA_2CuCl_4$/SWCNT heterojunction device) as high as 0.25.

Figure 2:
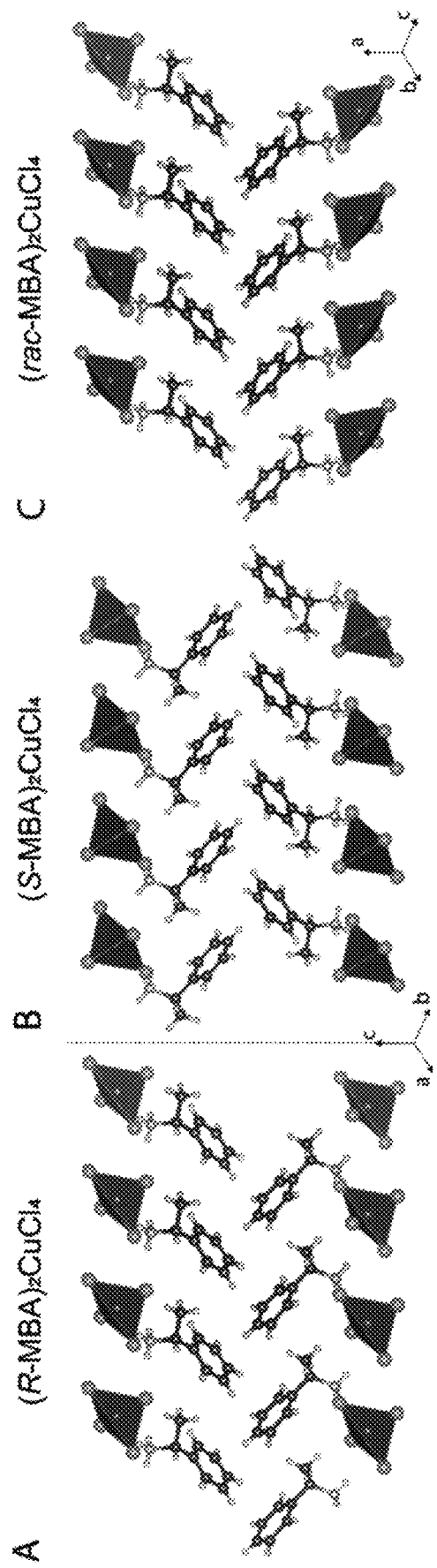
FIG. 2 illustrates crystal structures of the chiral compounds (R-MBA)$_2$CuCl$_4$ Panel (A) and (S-MBA)$_2$CuCl$_4$ Panel (B) from the side-view along c direction, and the racemic phase (rac-MBA)$_2$CuCl$_4$ Panel (C) from the side-view along a direction.

Crystal Structure of Chiral Copper Chloride Hybrids: Single crystals of chiral (R-/S-MBA)$_2$CuCl$_4$ and the racemic phase (rac-MBA)$_2$CuCl$_4$ were grown from concentrated isopropanol solutions containing stoichiometric amounts of MBACl and CuCl$_2$·2H$_2$O. Cooling to room temperature yielded thin green platelets of (MBA)$_2$CuCl$_4$. Crystallographic data and structure refinement information are summarized in Table 1. The chiral (R-MBA)2CuCl$_4$ and (S-MBA)$_2$CuCl$_4$ both crystallize in a chiral space group C2, while the racemic phase (rac-MBA)$_2$CuCl$_4$ crystallizes in the achiral orthorhombic space group Aea2. The crystal structures appear to be a layered lamellar structure (see FIG. 2), with a layer of disconnected CuCl$_4$ tetrahedra and a third layer of organic MBA cations. The overall crystal structure of (R-/S-MBA)$_2$CuCl$_4$ and (rac-MBA)$_2$CuCl$_4$ are very similar. However, the crystallographic packing direction is along the c direction for (R-/S-MBA)$_2$CuCl$_4$, while it is along the a direction for (rac-MBA)$_2$CuCl$_4$. Additionally, the unit cell size of (rac-MBA)$_2$CuCl$_4$ is around twice that of the (R-/S-MBA)$_2$CuCl$_4$ compounds.

TABLE 1

Crystal Data and Structure Refinement for (R-MBA)$_2$CuCl$_4$, (S-MBA)$_2$CuCl$_4$, and (rac-MBA)$_4$CuCl$_4$

| | Compound Name | | |
|---|---|---|---|
| | (R-MBA)$_2$CuCl$_4$ | (S-MBA)$_2$CuCl$_4$ | (rac-MBA)$_2$CuCl$_4$ |
| Empirical formula | C$_{16}$H$_{24}$N$_2$Cl$_4$Cu | C$_{16}$H$_{24}$N$_2$Cl$_4$Cu | C$_{16}$H$_{24}$N$_2$Cl$_4$Cu |
| Formula weight | | 449.71 | |
| Temperature | | 293(2) K | |
| Wavelength | | 0.71073 Å | |
| Crystal system | Monoclinic | Monoclinic | Orthorhombic |
| Space group | C2 | C2 | Aea2 |
| Unit cell dimensions | a = 10.580(7) Å, α = 90° | a = 10.542(10) Å, α = 90° | a = 27.6799(8) Å, α = 90° |
| | b = 7.235(3) Å, β = 95.96(4)° | b = 7.259(7) Å, β = 95.560(19)° | b = 10.5667(4) Å, β = 90° |
| | c = 13.974(10) Å, γ = 90° | c = 13.941(13) Å, γ = 90° | c = 7.2446(2) Å, γ = 90° |
| Volume | 1063.9(11) Å$^3$ | 1061.8(18) Å$^3$ | 2118.94(12) Å$^3$ |
| Z | 2 | 2 | 5 |
| Density (calculated) | 1.404 g/cm$^3$ | 1.407 g/cm$^3$ | 1.762 g/cm$^3$ |
| Absorption coefficient | 1.528 mm$^{-1}$ | 1.531 mm$^{-1}$ | 1.918 mm$^{-1}$ |
| F(000) | 462 | 462 | 1155 |
| θ range for data collection | 1.465 to 31.230° | 1.468 to 30.416° | 1.471 to 26.366° |
| Index ranges | −15 <= h <= 15, −10 <= k <= 10, −20 <= l <= 15 | −14 <= h <= 14, −9 <= k <= 10, −19 <= l <= 18 | −34 <= h <= 33, −13 <= k <= 13, −9 <= l <= 8 |
| Reflections collected | 6593 | 4237 | 12646 |
| Independent reflections | 3265 [R$_{int}$ = 0.0324] | 2725 [R$_{int}$ = 0.0290] | 2140 [R$_{int}$ = 0.0299] |
| Completeness to θ = 25.242° | 100% | 97.3% | 100% |

TABLE 1-continued

Crystal Data and Structure Refinement for (R-MBA)$_2$CuCl$_4$, (S-MBA)$_2$CuCl$_4$, and (rac-MBA)$_4$CuCl$_4$

| | (R-MBA)$_2$CuCl$_4$ | (S-MBA)$_2$CuCl$_4$ | (rac-MBA)$_2$CuCl$_4$ |
|---|---|---|---|
| Refinement method | | Full-matrix least-squares on F$^2$ | |
| Data/restraints/parameters | 3265/1/107 | 2725/1/107 | 2140/1/107 |
| Goodness-of-fit | 0.941 | 0.917 | 1.128 |
| Final R indices [I > 2σ(I)] | R$_{obs}$ = 0.0355, wR$_{obs}$ = 0.0717 | R$_{obs}$ = 0.0321, wR$_{obs}$ = 0.0592 | R$_{obs}$ = 0.0256, wR$_{obs}$ = 0.0675 |
| R indices [all data] | R$_{all}$ = 0.0671, wR$_{all}$ = 0.0820 | R$_{all}$ = 0.0555, wR$_{all}$ = 0.0659 | R$_{all}$ = 0.0274, wR$_{all}$ = 0.0685 |
| Largest diff. peak and hole | 0.380 and −0.291 e · Å$^{-3}$ | 0.379 and −0.209 e · Å$^{-3}$ | 0.249 and −0.170 e · Å$^{-3}$ |

R = Σ||F$_o$| − |F$_c$||/Σ|F$_o$|, wR = {Σ[w(|F$_o$|$^2$ − |F$_c$|$^2$)$^2$]/Σ[w(|F$_o$|$^4$)]}$^{1/2}$ and w = 1/[σ$^2$(Fo$^2$) + (0.0297P)$^2$] where P = (Fo$^2$ + 2Fc$^2$)/3

Figure 3:
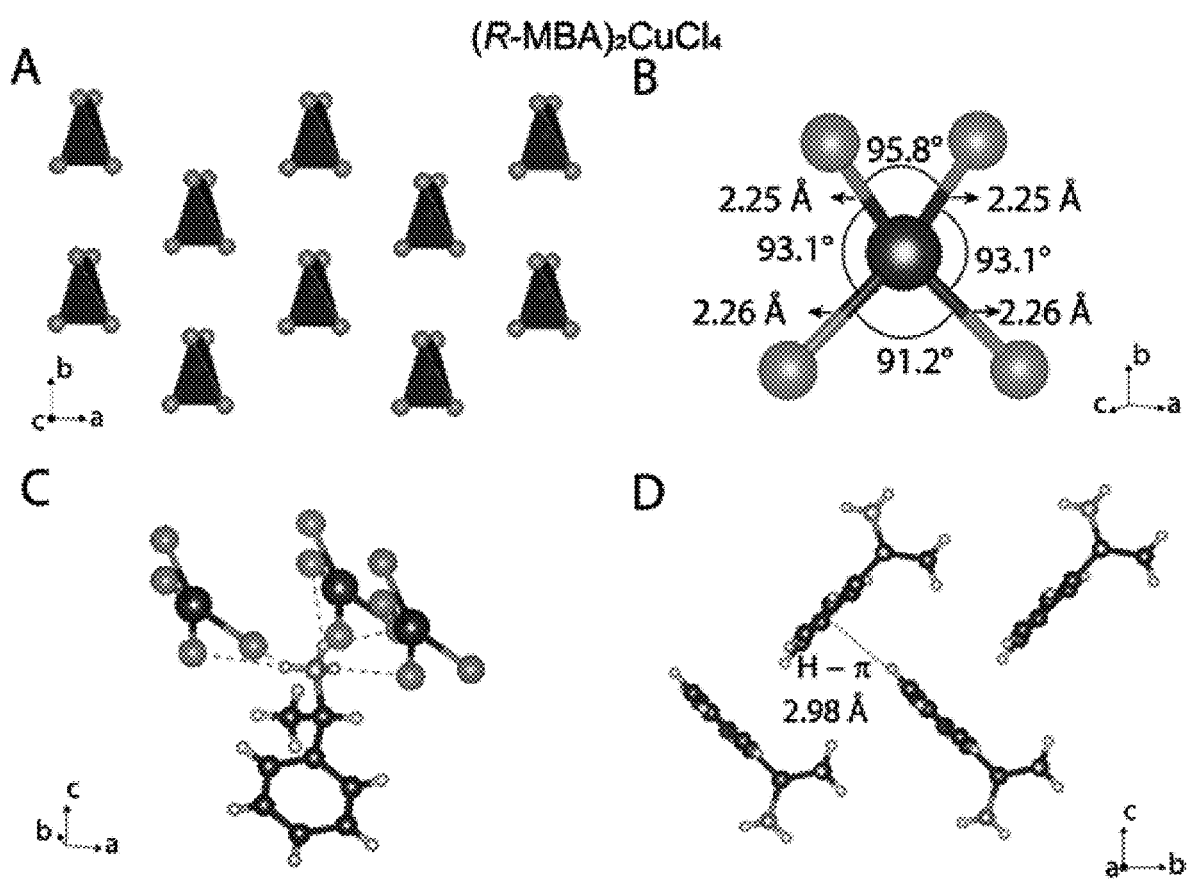
FIG. 3 illustrates in Panel (A) a crystal structure of (R-MBA)$_2$CuCl$_4$ from the top-down-view (organic cations are omitted for clarity). Panel (B) illustrates bond length and bond angles with a CuCl$_4$ tetrahedron. Panel (C) illustrates hydrogen bonds between the inorganic CuCl$_4$ and organic MBA cations. Panel (D) illustrates crystal packing arrangement for organic MBA cations showing the C—H . . . π interactions (inorganic CuCl$_4$ are omitted for clarity), according to some embodiments of the present disclosure.

The CuCl$_4$ tetrahedra can be conceptionally derived from the corner-sharing Jahn-Teller-distorted CuCl$_6$ octahedra in two steps: 1) the elongated Cu—Cl bonds may become longer so that the corner-sharing octahedra become disconnected; 2) the square planar CuCl$_4^{2-}$ ions may be further distorted to a tetrahedron geometry (see Panel A of FIG. 3). For example, in (R-MBA)$_2$CuCl$_4$, each CuCl$_4$ tetrahedron includes two Cu—Cl bonds with 2.25 Å length and two with 2.26 Å length (see Panel B of FIG. 3). The Cl—Cu—Cl bond angles within each tetrahedron range from 91.2° to 95.8°, all of which are modified from an ideal undistorted tetrahedron (109.5°). Such large CuCl$_4$ tetrahedra distortion may be a synergic effect from both a Jahn-Teller distortion in the inorganic CuCl and hydrogen bonds between the inorganic CuCl$_4^{2-}$ anions and organic MBA$^+$ cations. Panel C of FIG. 3 shows that the NH$_3$ headgroup in each MBA$^+$ cation forms 5 hydrogen bonds with the inorganic CuCl$_4$ layer. In addition, organic MBA$^+$ cations also interact with adjacent cations through C—H . . . π interactions (2.98 Å, see Panel D of FIG. 3). These non-covalent interactions thus stabilize the 3-dimensional crystal packing in the MBA$_2$CuCl$_4$ hybrids.

Figure 4A:
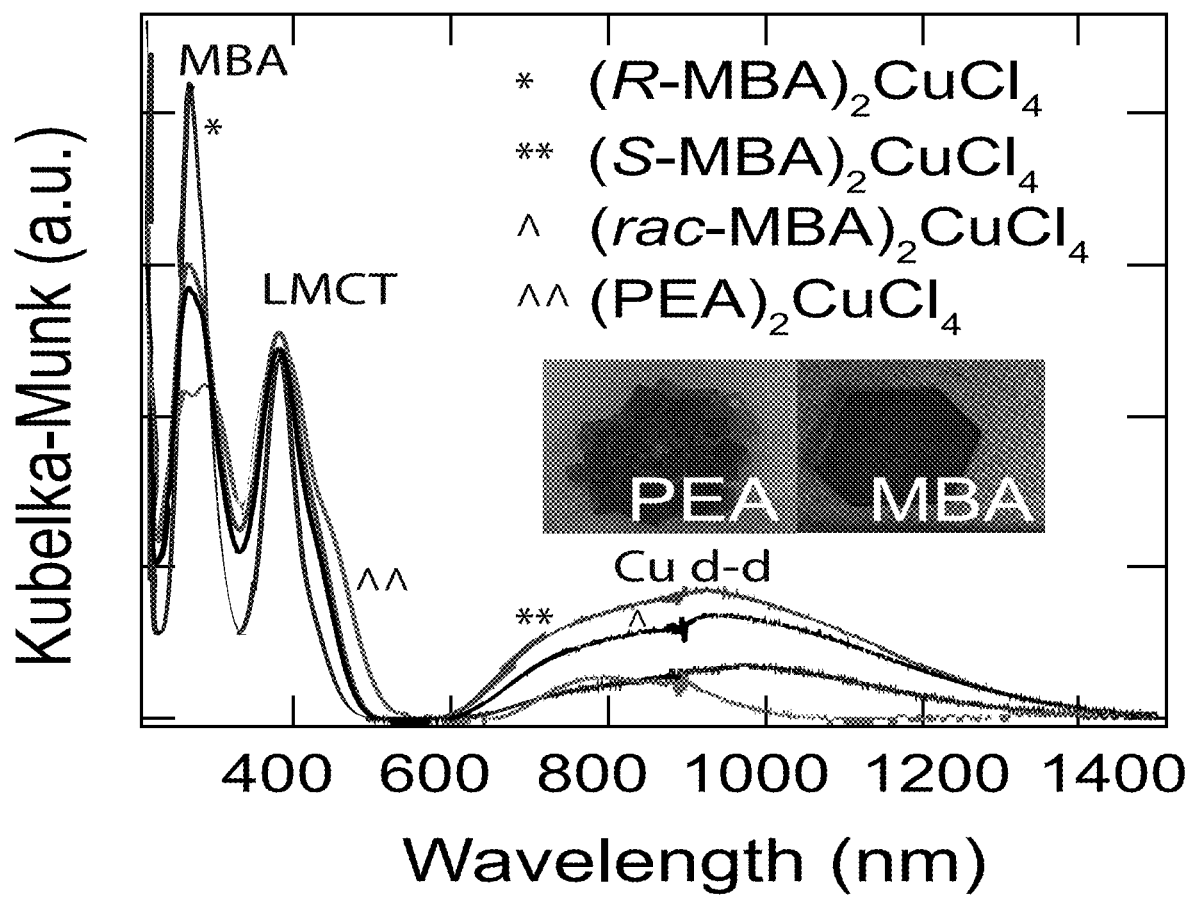
FIG. 4A illustrates linear UV-vis-NIR absorption spectra for (R-/S-/rac-MBA)$_2$CuCl$_4$ and (PEA)$_2$CuCl$_4$ compounds, according to some embodiments of the present disclosure.

Optical properties of the as-synthesized (MBA)$_2$CuCl$_4$ crystals were further characterized by linear absorption and circular dichroism (CD) spectroscopy. Linear optical spectra were measured by diffuse reflectance spectroscopy, and the absorption spectra of powders were obtained by converting reflectance to absorption using the Kubelka-Munk equation (see FIG. 4A). Both (MBA)$_2$CuCl$_4$ and (PEA)$_2$CuCl$_4$ displayed two strong UV absorption peaks (270 nm and 383 nm), and a broad vis-NIR band. The vis-NIR band in the (MBA)$_2$CuCl$_4$ compound covers from 580 to 1500 nm (1.31 eV range). The absorption peak at 270 nm is associated with the π→π* transition of MBA$^+$, while the peak at 383 nm and the Vis-NIR band are assigned to the ligand-to-metal charge transfer (LMCT) transition and the Cu d-d transitions, respectively, similar to what is reported for other layered Cu—Cl hybrid systems. The dispersed Cu d-d transitions are consistent with a high degree structural distortion of the inorganic CuCl$_4$ sublattice in the (MBA)$_2$CuCl$_4$ compounds.

To probe the chiroptical response in these chiral copper chloride hybrids, polycrystalline thin films were prepared by spin casting a dimethylformamide (DMF) solution of the corresponding crystals. Thin films of (R-MBA)$_2$CuCl$_4$ and (S-MBA)$_2$CuCl$_4$ display distinct bisignate CD peaks from 200 to 470 nm, while (rac-MBA)$_2$CuCl$_4$ shows no CD. The CD peaks at 380 nm correlate well with their linear absorption peaks (at 383 nm), indicating that the optical LMCT transitions associated with the inorganic CuCl$_4$ sublattice gain a chiroptical response resulting from the incorporation of the chiral MBA$^+$ cations. The chiroptical response mainly stems from the non-zero electric and magnetic transition dipole moments in a chiral space group, giving a non-zero rotational strength (R) as:

$$CD \propto R = Im[<\Psi_s|\hat{\mu}|\Psi_j> \cdot <\Psi_j|\hat{m}|\Psi_s>] = Im[\mu_{sj} \cdot m_{js}]$$

where $\Psi_s$ and $\Psi_j$ are the wave functions of the ground state and excited state and $\mu_{sj}$ and $m_{js}$ are the electric and magnetic transition dipole moments, respectively. Since (R-/S-MBA)$_2$CuCl$_4$ crystallizes in a non-centrosymmetric chiral space group, both $\mu_{sj}$ and $m_{js} \neq 0$, and the compounds should display CD.

The optical anisotropy factor, $g_{CD}$, is used to normalize the chiroptical response with respect to absorbance:

$$g_{CD} = \frac{CD[\text{mdeg}]}{32980 \times \text{Absorbance }[O.D.]}$$

Figure 4B:
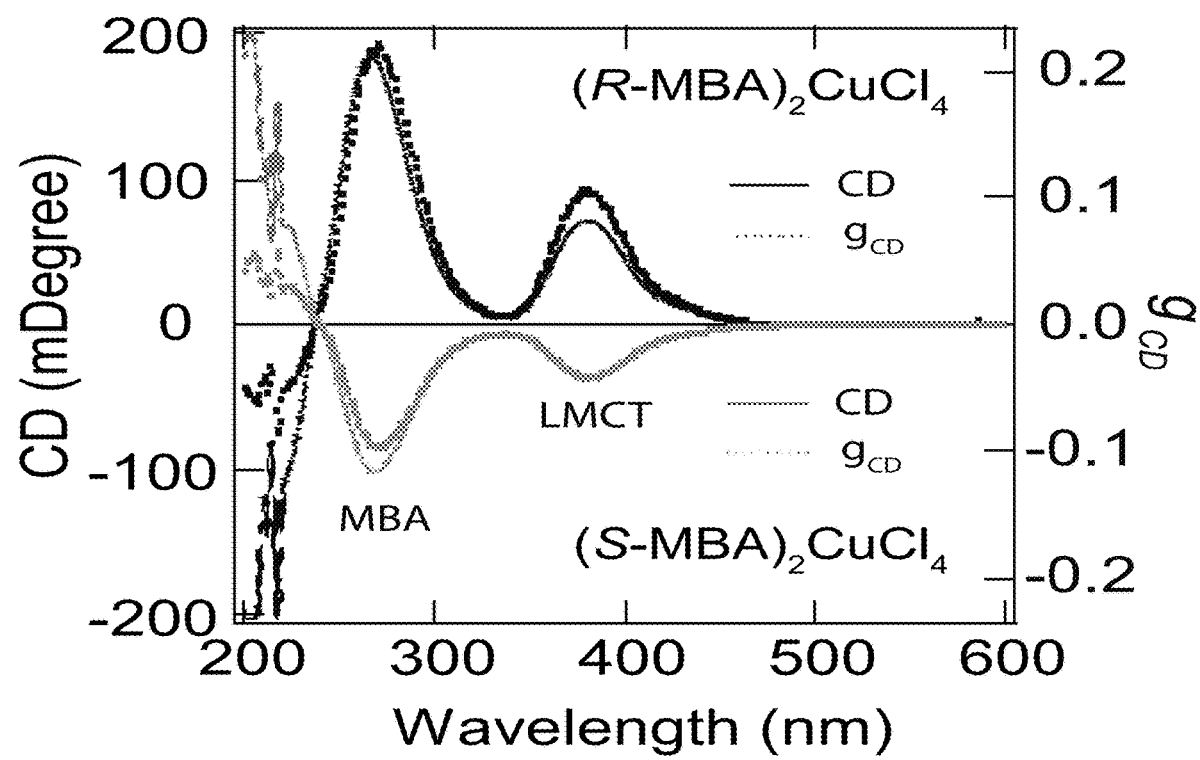
FIG. 4B illustrates CD spectra for (R-/S-/rac-MBA)$_2$CuCl$_4$ and (PEA)$_2$CuCl$_4$ compounds, according to some embodiments of the present disclosure. The CD signal is transformed to an anisotropy factor, $g_{CD}$.
Figure 5:
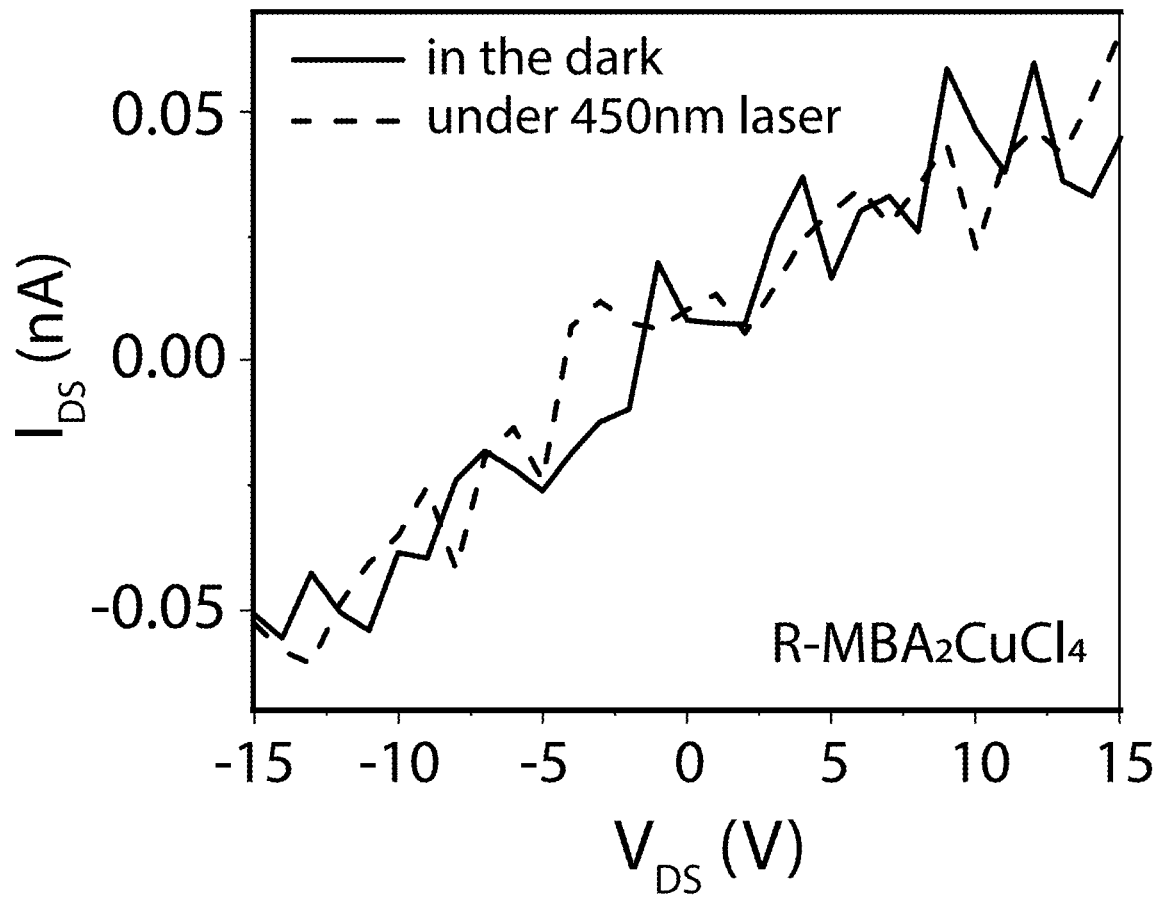
FIG. 5 illustrates the current to voltage sweeping plot of R-MBA$_2$CuCl$_4$ device (L$_{ch}$=10 μm) in the dark and under the 405 nm wavelength laser, according to some embodiments of the present disclosure.

The $g_{CD}$ factor of the LMCT peak at 380 nm is ~0.1 for (R-MBA)$_2$CuCl$_4$ thin film (see FIG. 4B), which is the highest achieved to date in chiral metal halide materials MBA$_2$CuCl$_4$/SWCNT Heterojunctions: Although (R-/S-MBA)$_2$CuCl$_4$ thin films possess good chiroptical activity to distinguish the polarization state of CPL, the material is electrically insulating (see FIG. 5), due to the lack of connectivity between isolated CuCl$_4$ tetrahedra. An appropriately designed interface with a highly conductive transport material is therefore needed to effectively transduce photons absorbed by MBA$_2$CuCl$_4$ into electrical current. To achieve this, the chiral MBA$_2$CuCl$_4$ absorber layer was combined with a transport layer of highly enriched (6,5) semiconducting SWCNTs, resulting in the complete composition capable of CPL detection. The chiral MBA$_2$CuCl$_4$/SWCNT heterojunctions were prepared by spin-coating the chiral MBA$_2$CuCl$_4$ materials on top of prefabricated (6,5) SWCNT networks, either on quartz substrates for optical characterization or on bottom-gated and bottom-contacted FET architectures for electrical characterization. Unless otherwise noted, the heterojunctions had a total thickness of about 50 nm, with the SWCNT layer being about 10 nm thick.

Figure 6A:
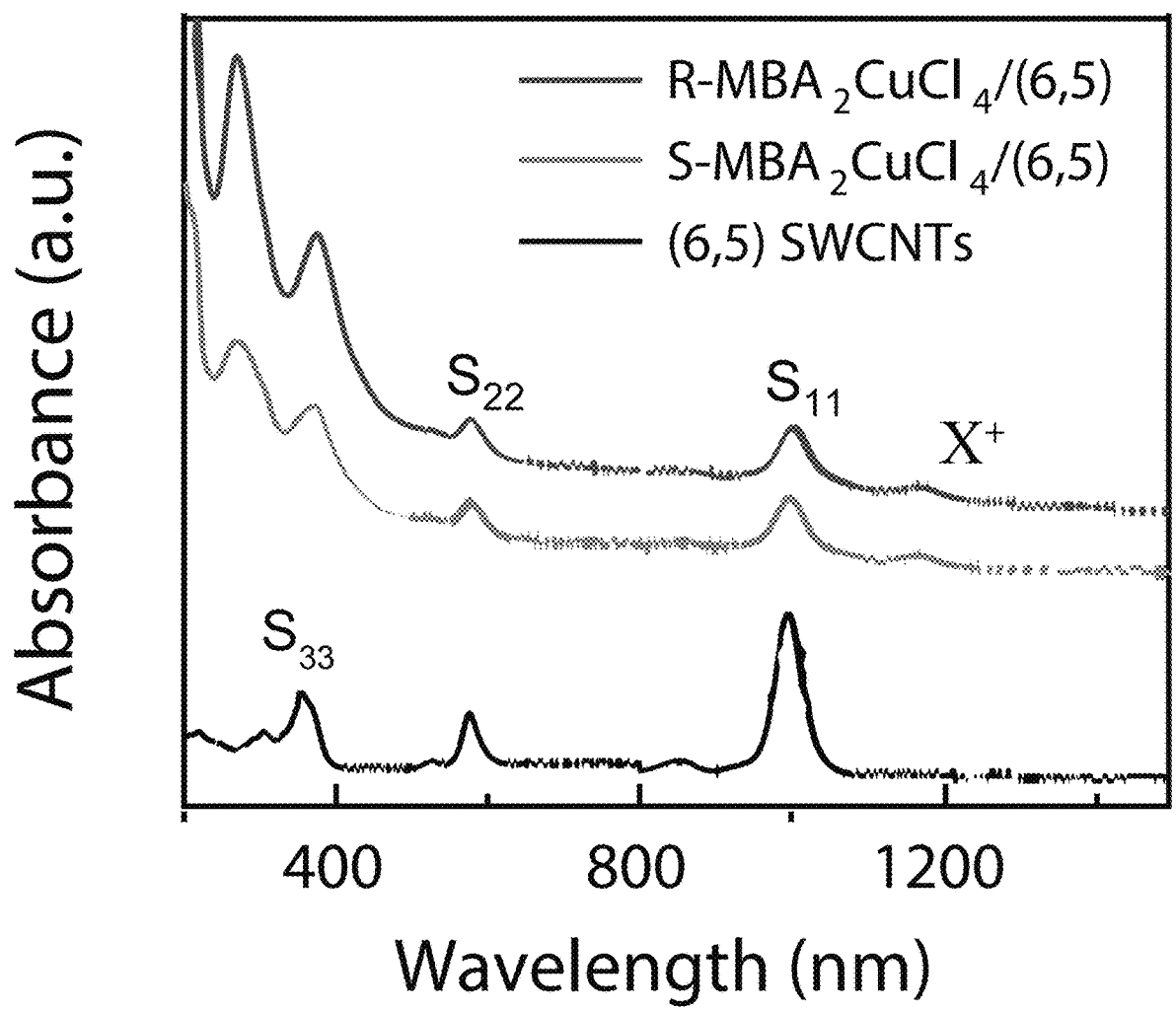
FIG. 6A illustrates absorption spectra of an exemplary (6,5) SWNT network, R-MBA$_2$CuCl$_4$/SWCNT heterojunction, and S-MBA$_2$CuCl$_4$/SWCNT heterojunction, according to some embodiments of the present disclosure.
Figure 6B:
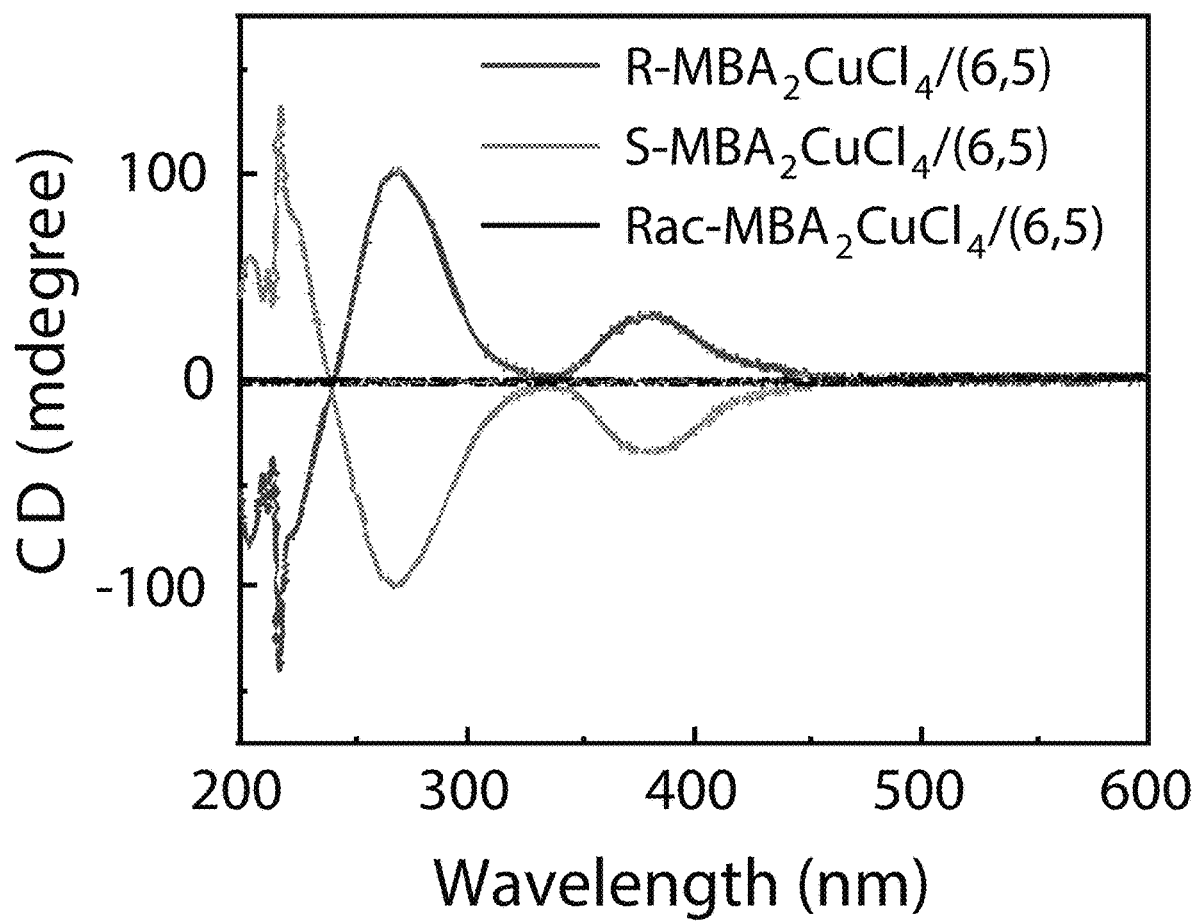
FIG. 6B illustrates CD spectra of R- and S-MBA$_2$CuCl$_4$/(6,5) SWCNT heterojunctions and a (rac-MBA)$_2$CuCl$_4$/(6, 5) SWCNT heterojunction, according to some embodiments of the present disclosure.

FIG. 6A shows the linear absorption spectra for (6,5) SWCNT networks, (R-MBA)$_2$CuCl$_4$/(6,5) SWCNT, and (S-MBA)$_2$CuCl$_4$/(6,5) SWCNT heterojunctions. The new peak in the heterojunction structure, labelled X$^+$, is assigned to the optical transition of charged excitons (trions) in (6,5) SWCNT networks. The presence of the trion peak indicates a ground-state charge carrier density (holes, vide infra) in the heterojunctions, and therefore ground-state charge transfer occurs at the MBA$_2$CuCl$_4$/SWCNT interface. The transmission CD measurement shown in FIG. 6B indicates that the MBA$_2$CuCl$_4$/SWCNT heterojunctions display essentially the same chiroptical response as neat the MBA$_2$CuCl$_4$ films, suggesting that the SWCNT network does not impact the ability of MBA$_2$CuCl$_4$ to discriminate between right- and left-handed CPL.

Figure 6C:
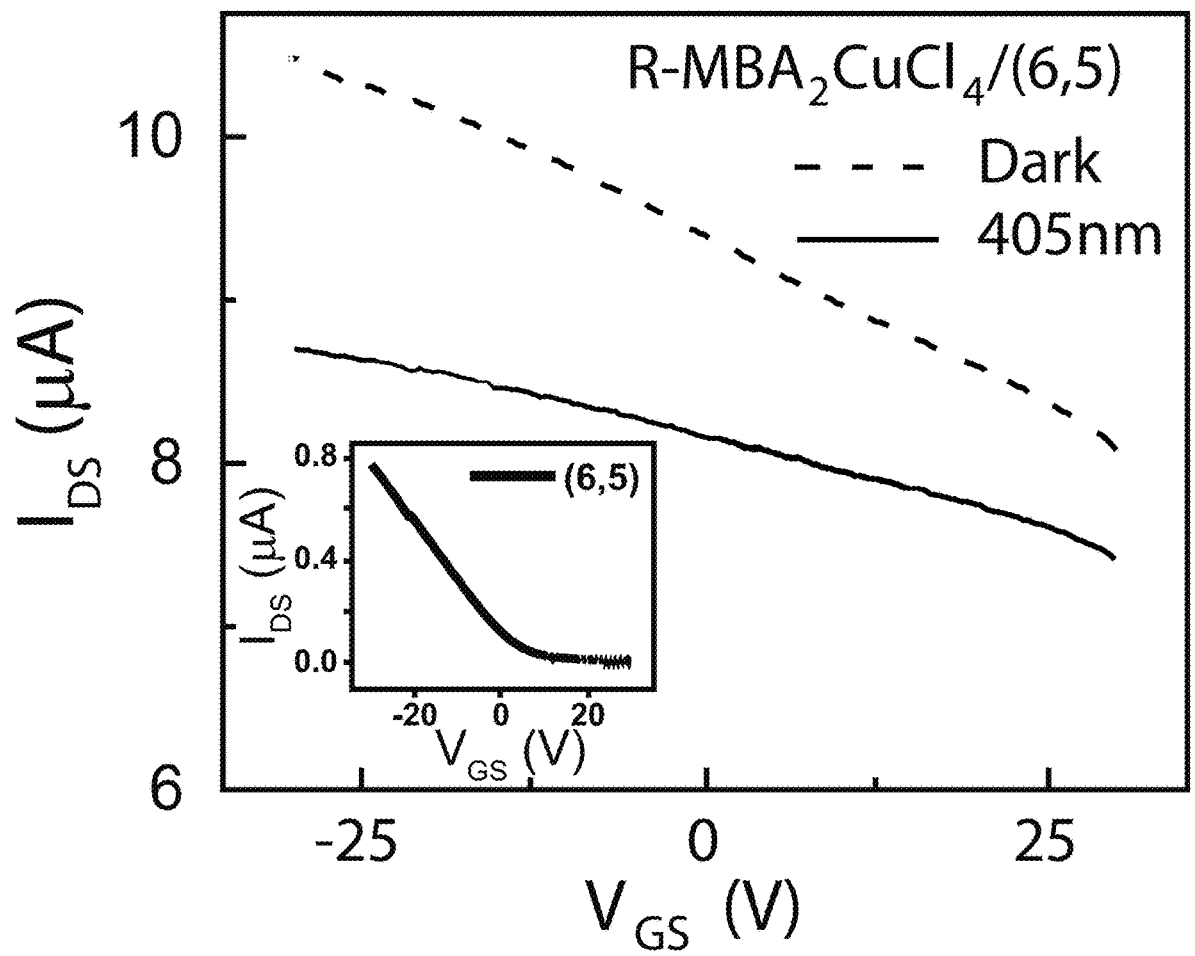
FIG. 6C illustrates a FET transfer curve of a R-MBA$_2$CuCl$_4$/(6,5) SWCNT heterojunction in the nitrogen-filled glovebox under V$_{DS}$=0.1V, and the transfer curve of (6,5) SWCNTs under V$_{DS}$=3V is shown in the inset, according to some embodiments of the present disclosure.

The direction of ground-state charge transfer at the MBA$_2$CuCl$_4$/SWCNT interface was verified by FET measurements (see FIG. 6C), by comparing the dark FET transfer curves of the R-MBA$_2$CuCl$_4$/(6,5) SWCNT heterojunction to that of just the (6,5) SWCNTs (inset). Due to the very low conductivity and mobility of chiral MBA$_2$CuCl$_4$ compared with the SWCNT networks, the channel current of the heterojunction is dominated by hole transport within the (6, 5) SWCNT networks. The threshold voltage ($V_{th}$) of the heterojunction FET is more than 30 V, a large shift in the positive direction compared to the threshold voltage of the SWCNT FET ($V_{th} \approx 10V$). This large shift in $V_{th}$ indicates that a net transfer of holes from chiral MBA$_2$CuCl$_4$ to SWCNTs results in a more p-type SWCNT network, which is due to the Cu$^{2+}$ physisorption and redox reaction to extract electrons from SWCNT networks.

Figure 6D:
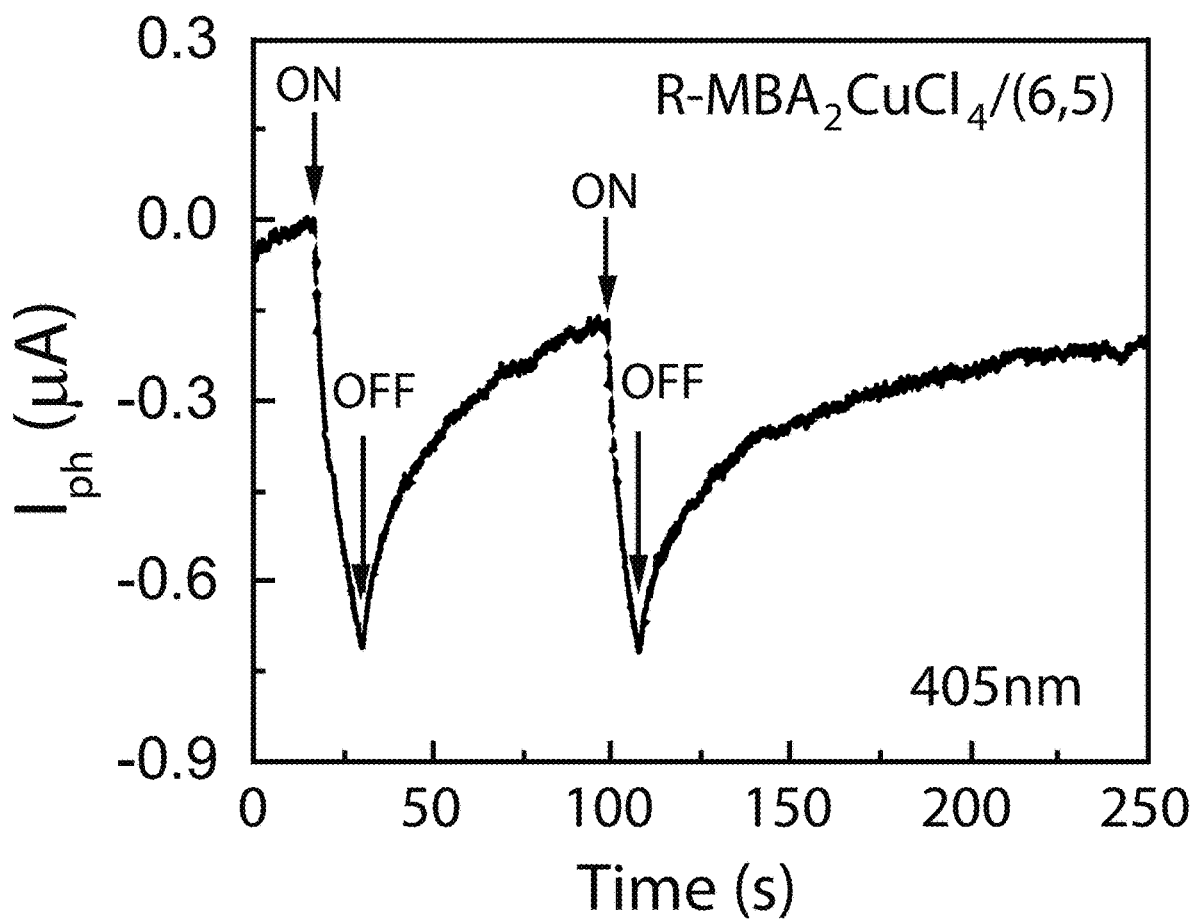
FIG. 6D illustrates a negative photocurrent response of a (R-MBA)$_2$CuCl$_4$/SWCNT heterojunction under V$_{DS}$=0.1V as a function of time as the 405 nm laser (1.1×10$^{-3}$mW/cm$^2$) is successively turned on and off, according to some embodiments of the present disclosure.
Figure 6E:
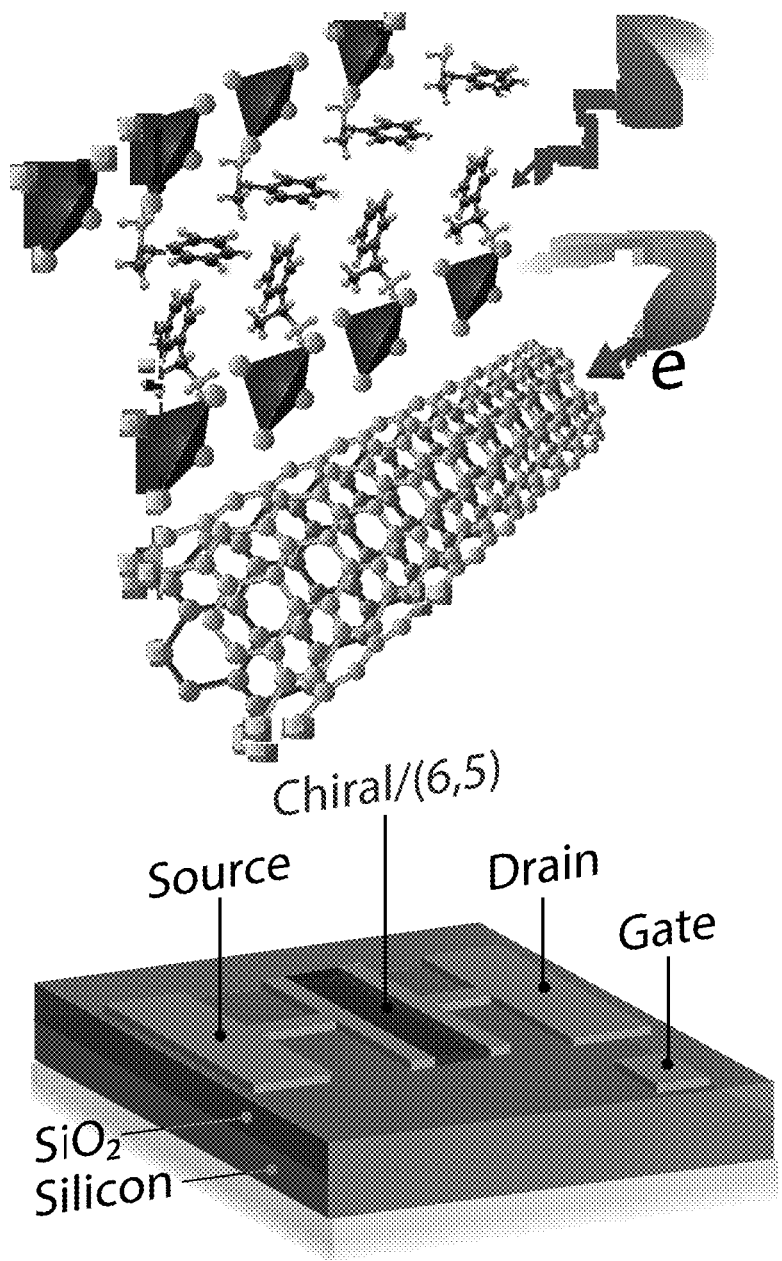
FIG. 6E illustrates a schematic of a MBA$_2$CuCl$_4$/(6,5) SWCNT interface and photoexcited electron transfer across the heterojunction interface to modify the channel current of the phototransistor (top) and the FET device architecture with a back-gated, 3-terminal (source-S, drain-D, and gate-G) configuration (bottom), according to some embodiments of the present disclosure.

Under 405 nm laser illumination, the source-drain current (IDs) of the heterojunction FET decreased significantly, and the threshold voltage shifted towards the negative direction. Both effects are consistent with a photoinduced electron transfer from chiral MBA$_2$CuCl$_4$ to the SWCNT networks (see FIG. 6E). Since the (6,5) SWCNT transport channel is heavily p-type for the heterojunction in the dark, the transfer of photoinduced electrons into the SWCNT networks compensates some fraction of the native hole density, decreasing IDs and generating the negative $V_{th}$ shift. The negative photocurrent response was also confirmed by real-time photocurrent ($I_{ph}$) measurements under a non-polarized 405 nm laser (see FIG. 6D). In these measurements, $I_{ph}=I_{laser}-I_{dark}$, where $I_{laser}$ is the current level of the device under laser illumination and $I_{dark}$ is the current level of the device in the dark.

Figure 7A:
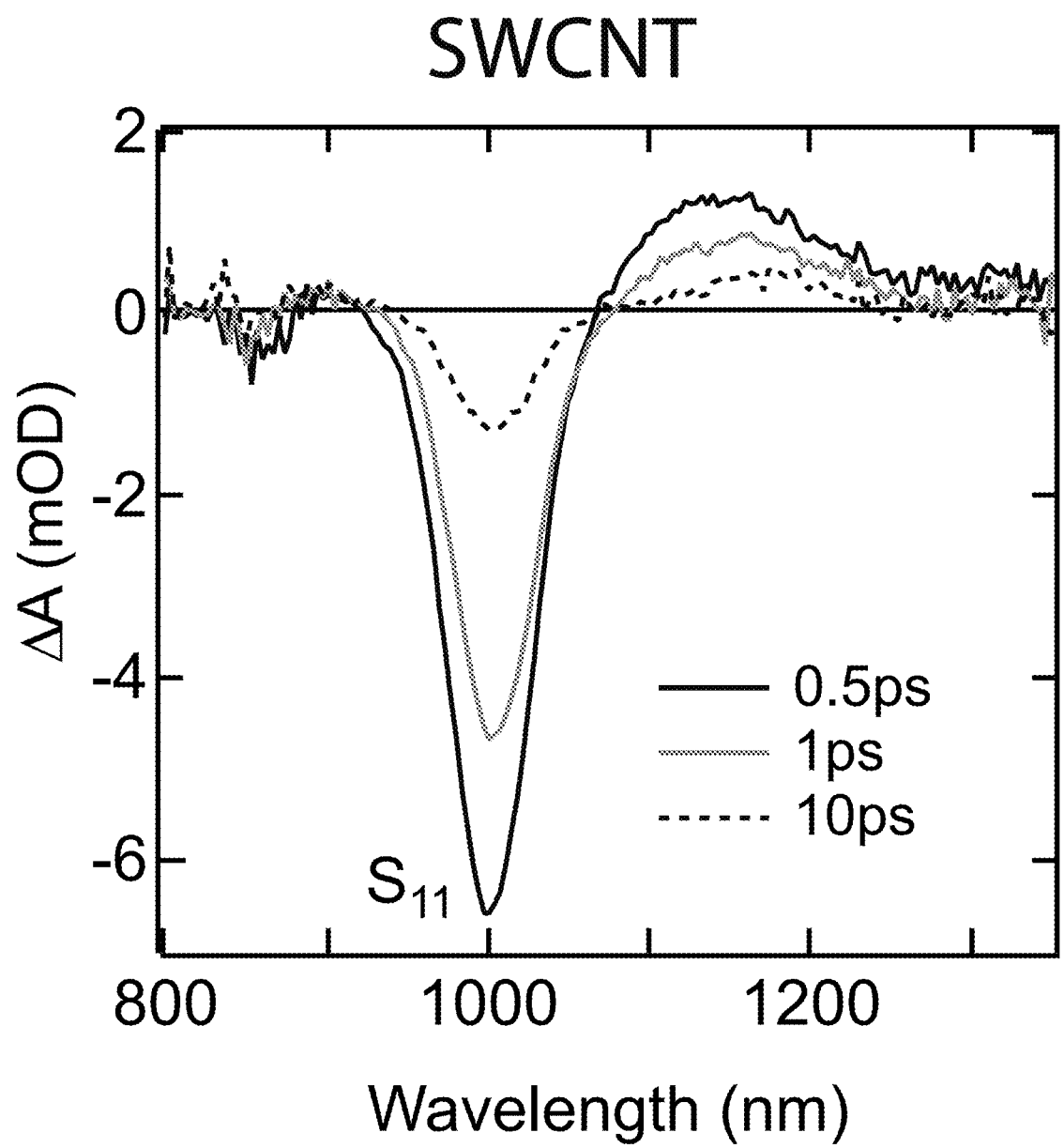
FIG. 7A illustrates femtosecond TA spectra of SWCNT and R-MBA$_2$CuCl$_4$, according to some embodiments of the present disclosure.
Figure 7B:
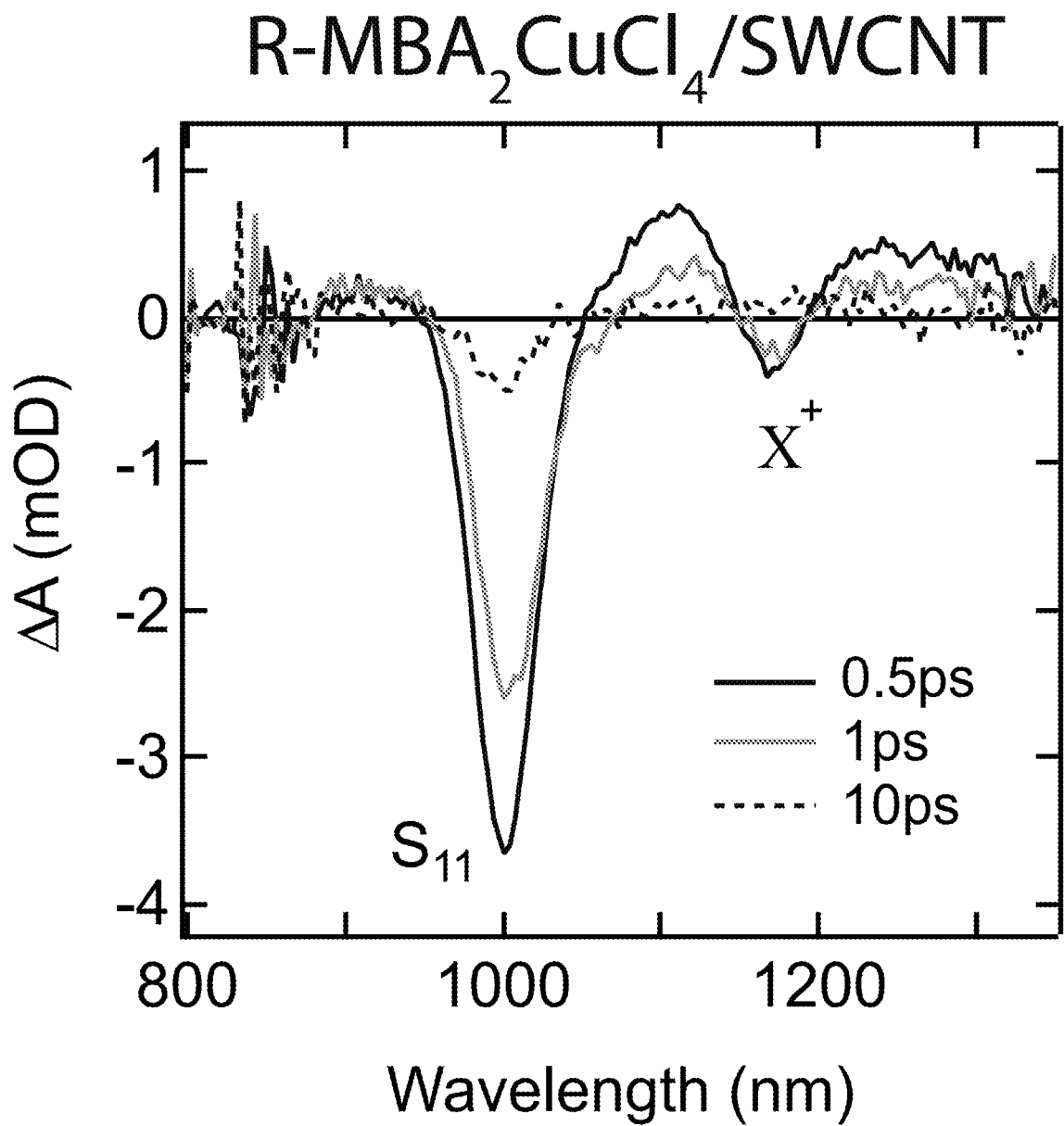
FIG. 7B illustrates femtosecond TA spectra of SWCNT thin films collected in the NIR region (pumped at 400 nm), according to some embodiments of the present disclosure.
Figure 7C:
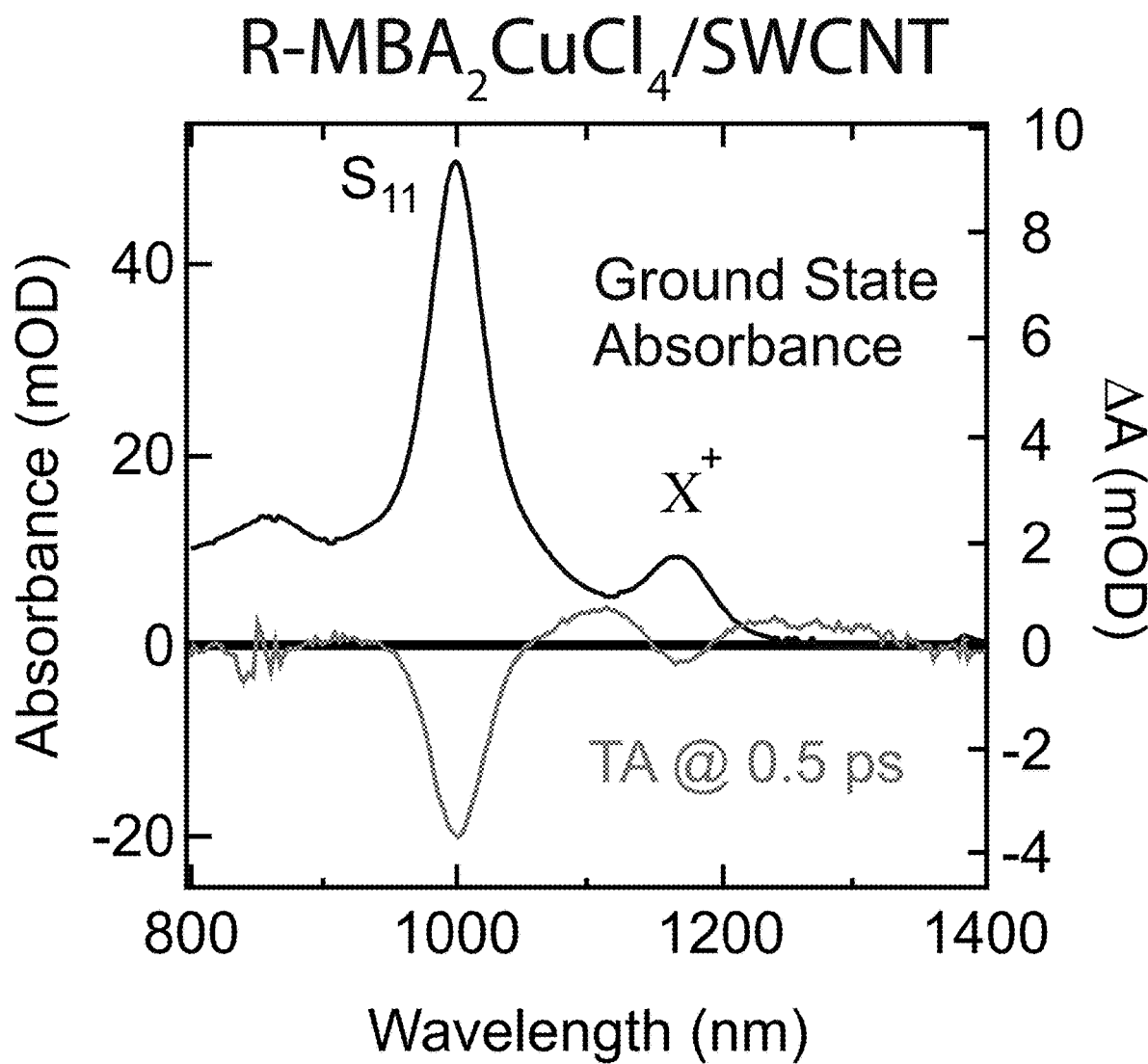
FIG. 7C illustrates a comparison of the TA spectrum at 0.5 ps (right axis) to the ground state absorbance of the R-MBA$_2$CuCl$_4$/SWCNT (left axis), according to some embodiments of the present disclosure.

The inferred mechanism of photoinduced electron transfer from chiral MBA$_2$CuCl$_4$ to SWCNT networks was confirmed by transient absorption (TA) spectroscopy. Femtosecond TA spectra of SWCNT (see FIG. 7A) and MBA$_2$CuCl$_4$/SWCNT (see FIG. 7B) networks were collected in the NIR region using a pump excitation wavelength of 400 nm. The TA spectra of SWCNTs are dominated by the $S_{11}$ exciton bleach at 1000 nm, while that of MBA$_2$CuCl$_4$/SWCNTs includes the $S_{11}$ exciton bleach and a negative-pointing peak at 1180 nm corresponding to the trion transition. The bleaches of the $S_{11}$ and X$^+$ ground states can be seen clearly when compared to the ground state absorption shown in FIG. 7C. The prompt photoinduced bleach of the X$^+$ ground state absorbance suggests a rapid reduction in the ground-state hole density of the SWCNT network. Thus, this observation is consistent with a photoinduced electron transfer process from MBA$_2$CuCl$_4$ to SWCNTs that compensates some fraction of native holes in the SWCNT network. In each of FIGS. 7A, 7B, and 7C, the scattering background is subtracted from the ground state absorbance to achieve zero absorbance beyond 1300 nm. The 400 nm pulse energy in the TA experiments is 125 nJ.

Figure 8A:
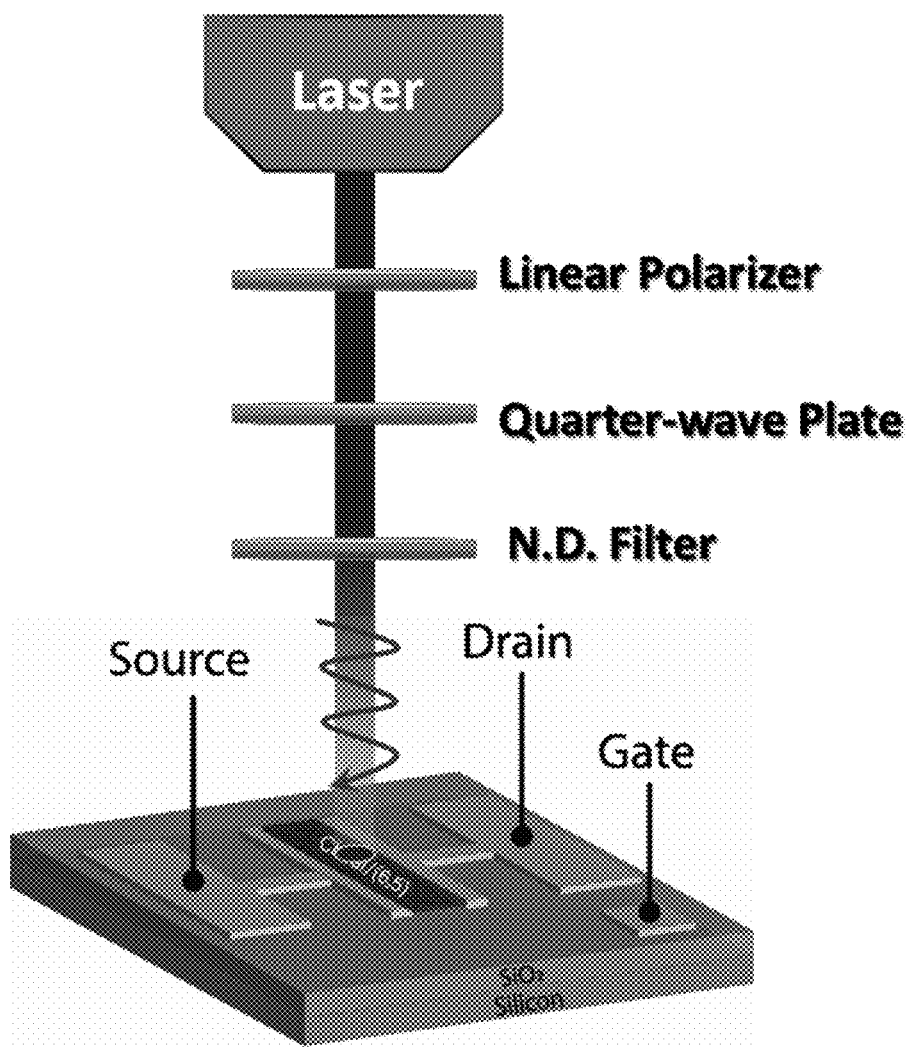
FIG. 8A illustrates a schematic showing the experimental setup to generate left (LCP) and right (RCP) circular polarized light), according to some embodiments of the present disclosure.

Circular Polarized Light Detection: Since the CD spectra demonstrate that chiral MBA$_2$CuCl$_4$/SWCNT heterojunctions can discriminate well between right- and left-handed CPL, the optoelectronic CPL detection in heterojunction photodetectors was demonstrated next. The photodetector architecture (see FIG. 8A) included a spin-cast thin film of MBA$_2$CuCl$_4$ on top of a prefabricated (6, 5) SWCNT network that spanned the width of a 10 µm bottom-contacted FET transport channel. Continuous wave left-handed circularly polarized (LCP) and right-handed circularly polarized (RCP) excitation beams were generated using a 405 nm laser diode, a linear polarizer, a quarter waveplate, and an adjustable neutral density filter. This experimental setup was placed in a nitrogen-filled glovebox and carefully calibrated to ensure equal intensities for the generated LCP and RCP excitation beams.

Figure 8B:
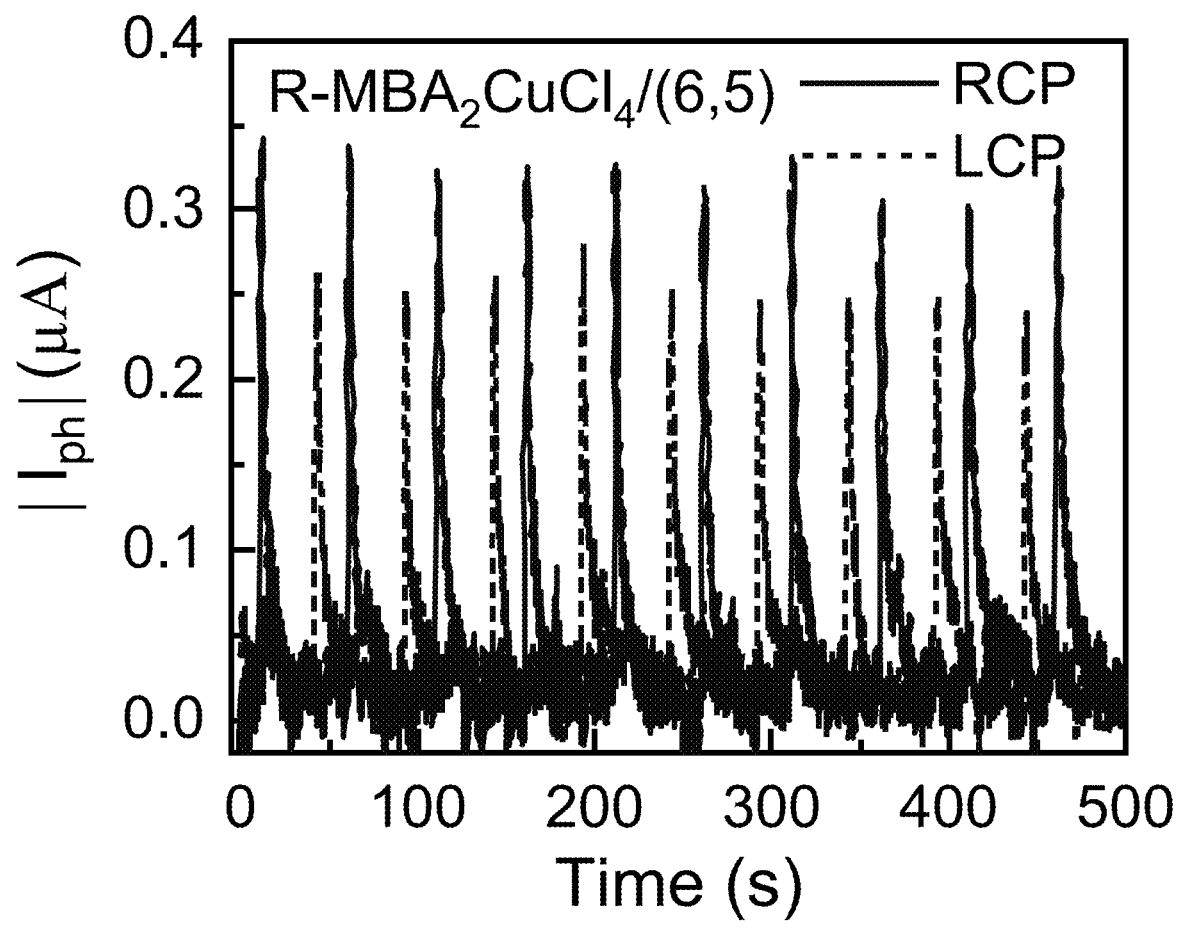
FIGS. 8B-D illustrate direct circular polarized light (CPL) detection by using R- and S-MBA$_2$CuCl$_4$/(6,5) SWCNT heterojunctions. These figures illustrate variation of the absolute value of photocurrent change (|I$_{ph}$|) vs. time for R-, S- and rac-MBA$_2$CuCl$_4$/(6,5) SWCNT heterojunctions under the illumination of pulse mode 405 nm RCP and LCP laser separately under V$_{DS}$=2V, according to some embodiments of the present disclosure.
Figure 8C:
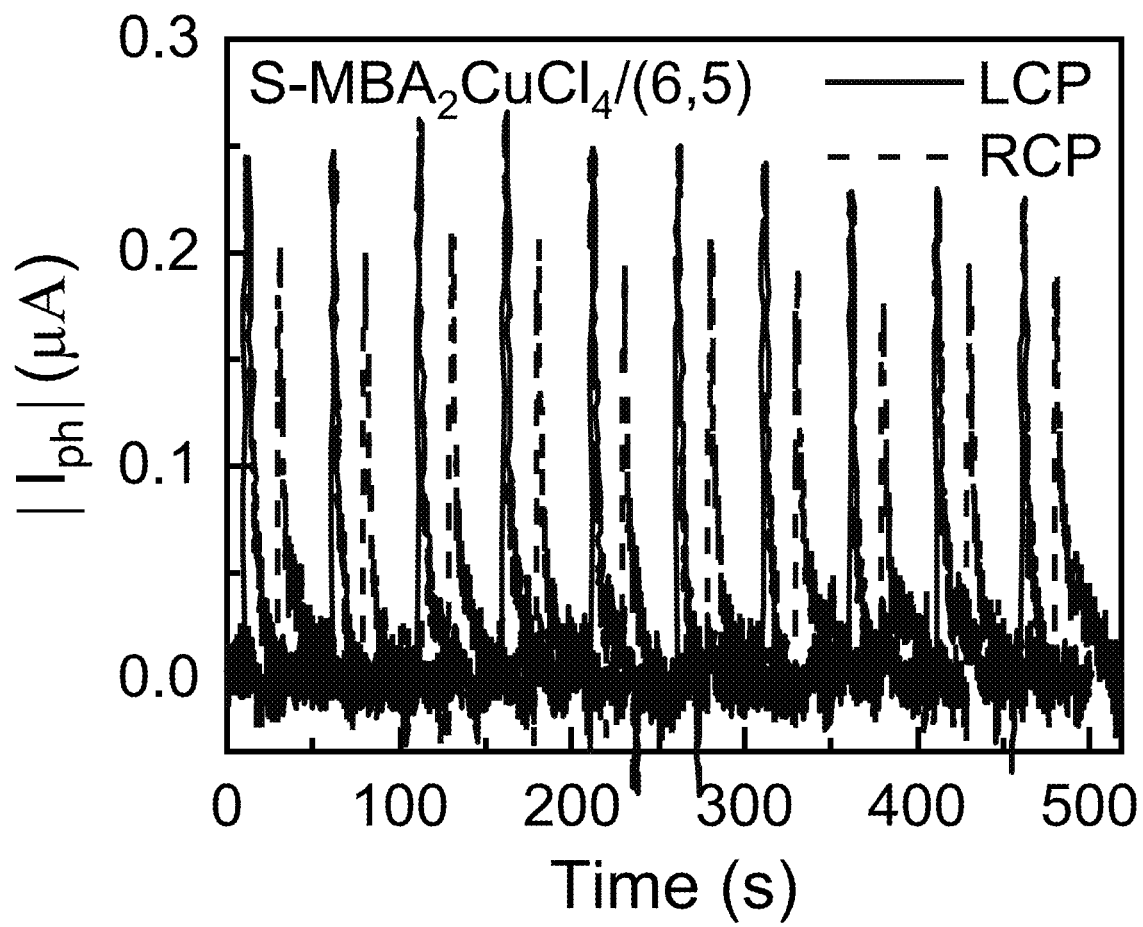
Figure 8D:
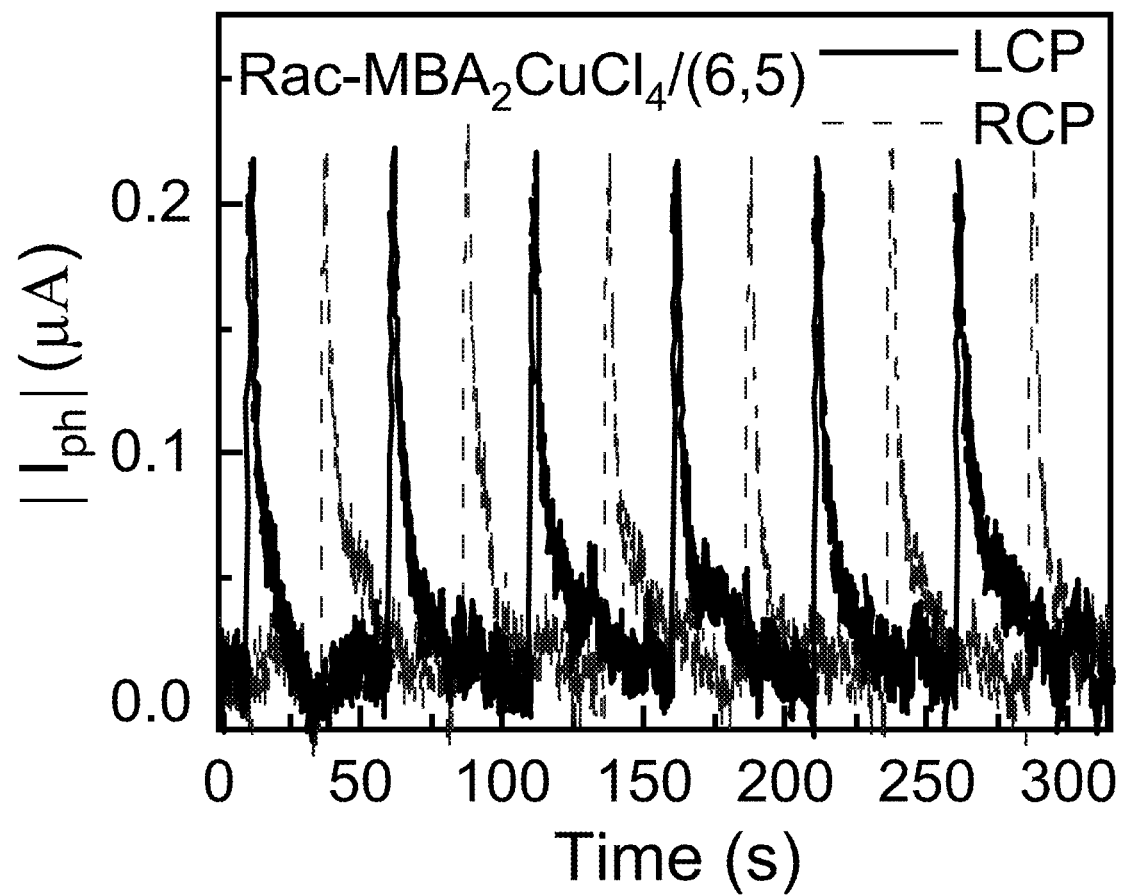
Figure 8E:
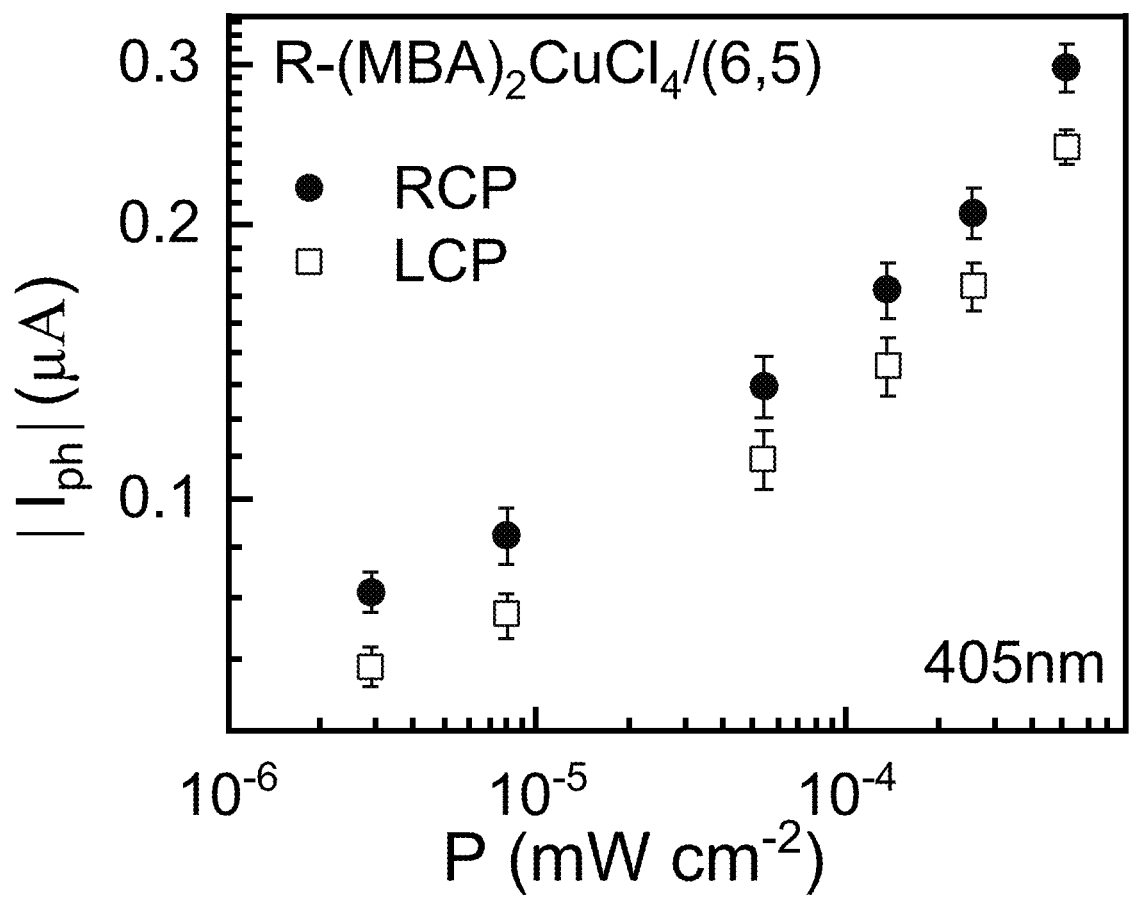
FIG. 8E illustrates a photocurrent response as a function of light intensity of a (R-MBA)$_2$CuCl$_4$/(6,5) SWCNT heterojunction device under the LCP and RCP illumination, separately, according to some embodiments of the present disclosure.
Figure 8F:
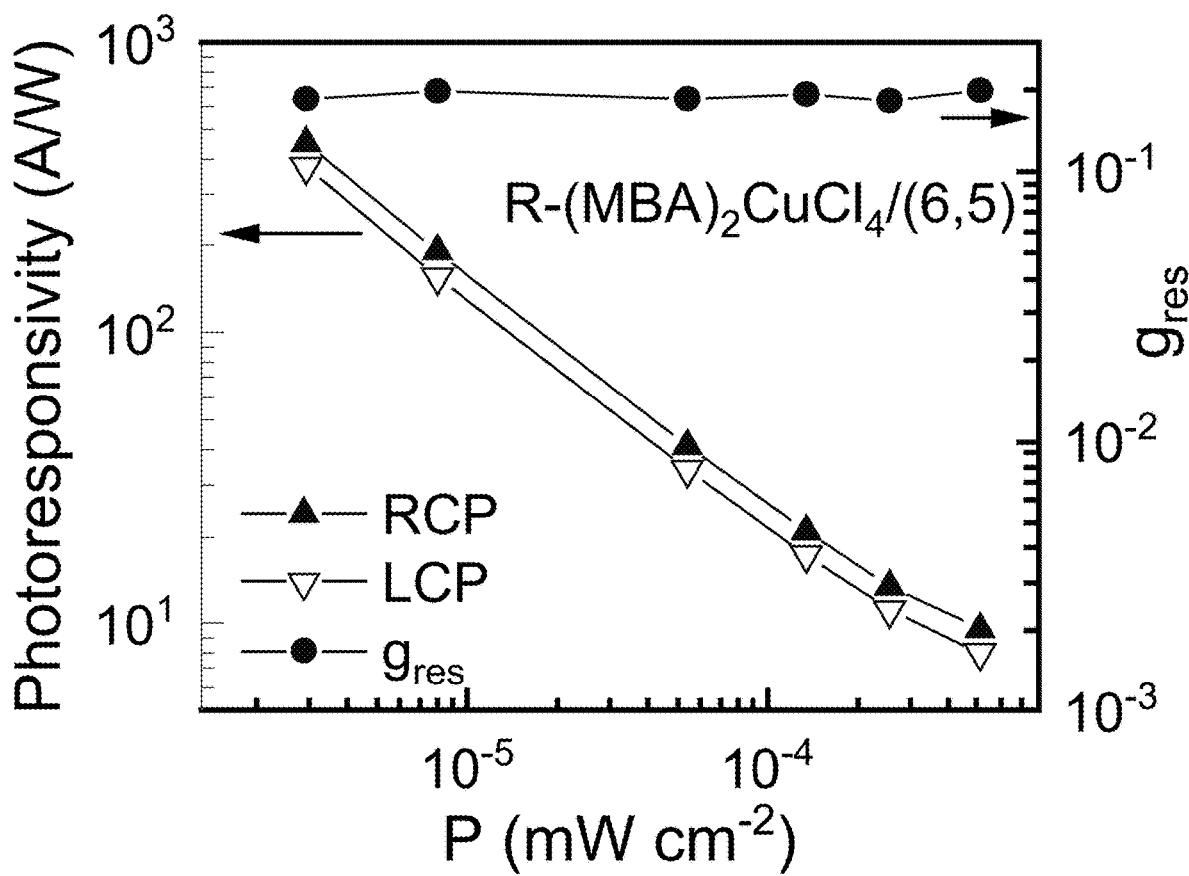
FIG. 8F illustrates light intensity-dependent photoresponsivity and $g_{res}$ at V$_{DS}$=2V under 405 nm RCP and LCP illumination, according to some embodiments of the present disclosure.

FIGS. 8B-D show the time-dependent photocurrent response from R-, S-, and rac-MBA$_2$CuCl$_4$/SWCNT heterojunctions, displayed as the absolute value of $I_{ph}$, $|I_{ph}|$. This experiment utilized pulsed-mode LCP and RCP illumination with equivalent intensity, a laser pulse duration of 2 seconds, and a pulse period of 50 seconds. For the R-MBA$_2$CuCl$_4$/SWCNT heterojunction, $|I_{ph}|$ under RCP illumination was larger than that under LCP illumination, while the photocurrent anisotropy was reversed for the S-MBA$_2$CuCl$_4$/SWCNT heterojunction. In contrast, there was no photocurrent anisotropy for the Rac-MBA$_2$CuCl$_4$/SWCNT heterojunction devices. These results clearly demonstrate that the R/S chiral MBA$_2$CuCl$_4$/SWCNT photodetectors can be used to directly detect CPL. The dependence of photocurrent ($|I_{ph}|$) and photoresponsivity (R) on illumination intensity (see FIGS. 8E and 8F) was also evaluated. Photoresponsivity (R) is defined as:

$$R = |I_{ph}|/(P \times A)$$

where P is incident light power density and A is channel area. The R-MBA$_2$CuCl$_4$/SWCNT heterojunction demonstrated successful discrimination between LCP and RCP 405 nm photons for over three orders of magnitude in incident light intensity.

Figure 8G:
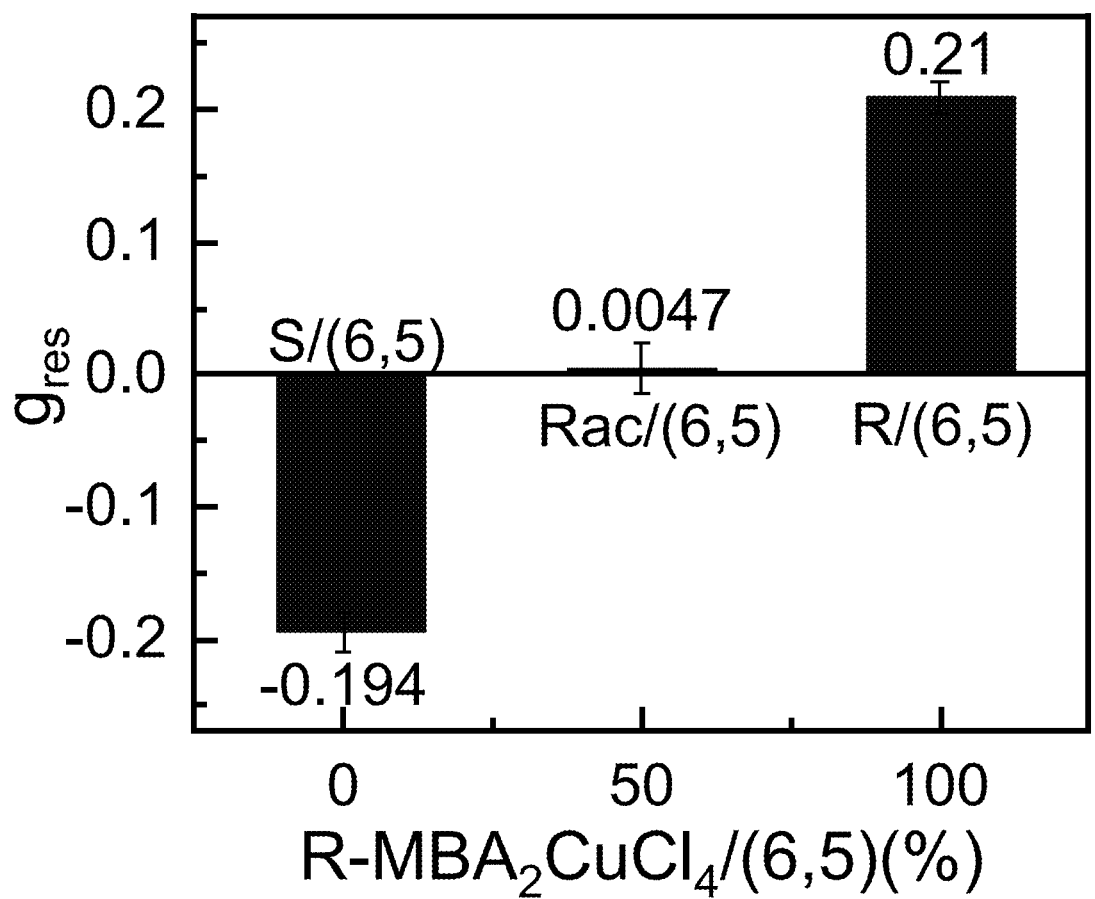
FIG. 8G illustrates the percentages of (R-MBA)$_2$CuCl$_4$ dependent $g_{res}$ factor under 405 nm RCP and LCP illumination at V$_{DS}$=2V, according to some embodiments of the present disclosure.
Figure 9:
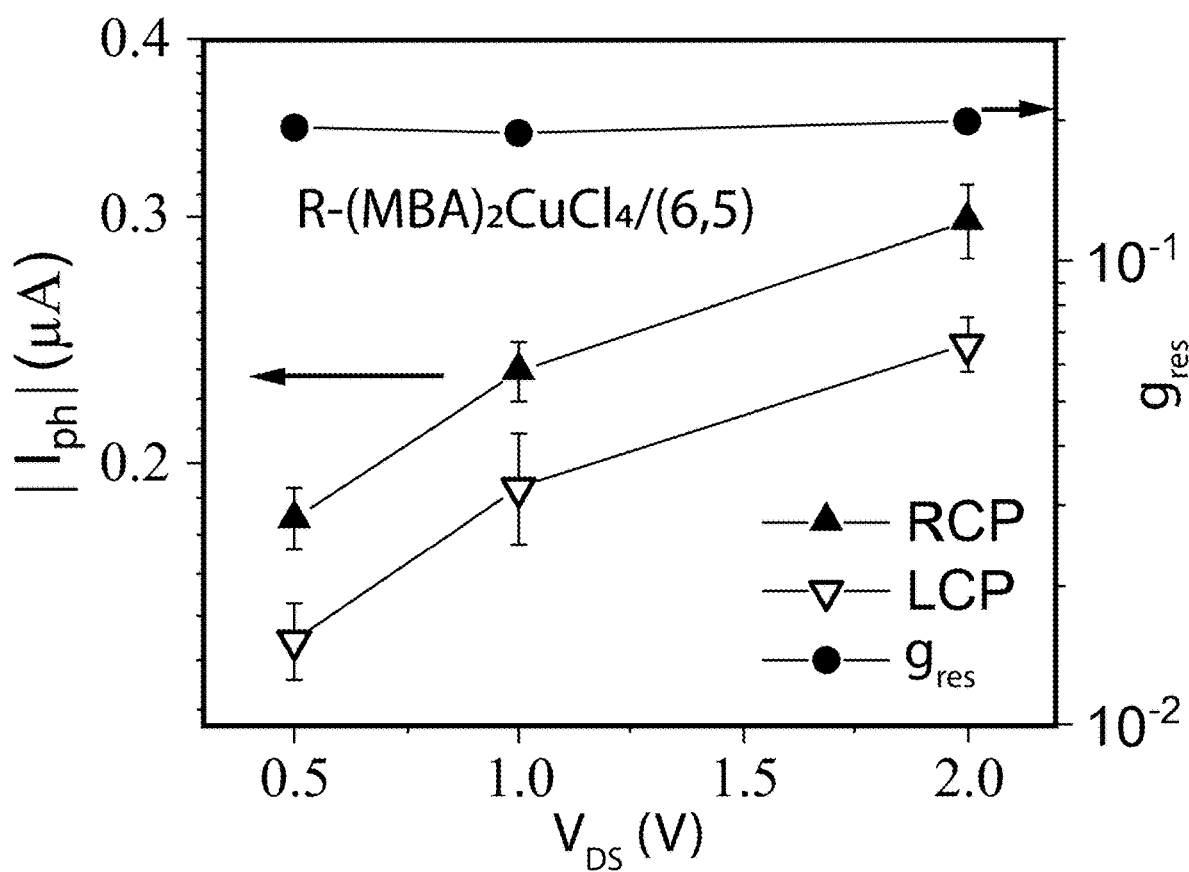
FIG. 9 illustrates a source-drain voltage-dependent photocurrent response and anisotropy factor ($g_{res}$) of (R-MBA)$_2$CuCl$_4$/(6,5) SWCNT heterojunction device under the RCP and LCP light, according to some embodiments of the present disclosure.
Figure 10:
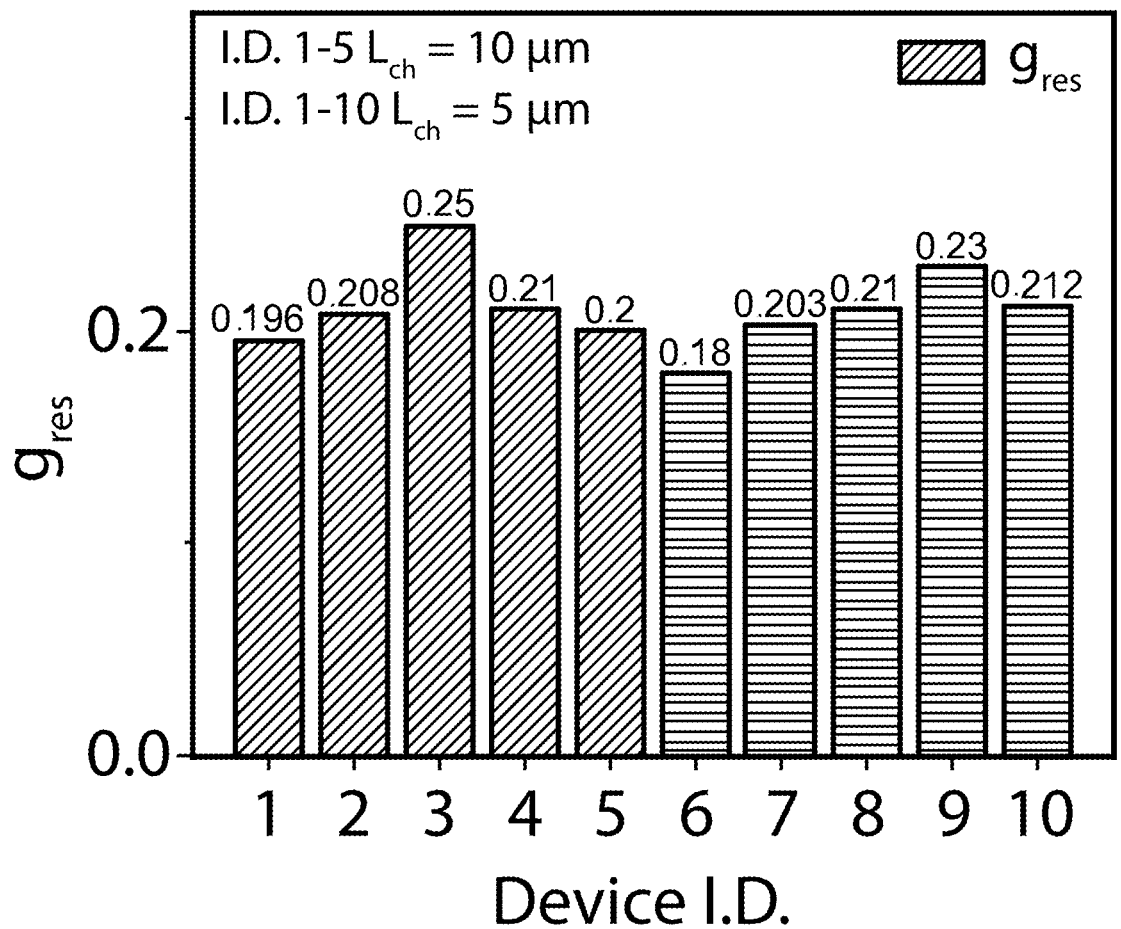
FIG. 10 illustrates the variation of anisotropy factors ($g_{res}$) of 10 different (R-MBA)$_2$CuCl$_4$/(6,5) SWCNT heterojunction devices with 50 nm thickness under 2V voltage bias, according to some embodiments of the present disclosure.

The anisotropy factor of photoresponsivity ($g_{res}$) was calculated to evaluate the effectiveness for discriminating between different photon helicities:

$$g_{res} = 2 \times \frac{R_R - R_L}{R_R + R_L}$$

where $R_L$ and $R_R$ are the photoresponsivity under LCP and RCP illumination, respectively. The $g_{res}$ magnitude of ~0.2 is independent of light intensity (see FIG. 8F) and $V_{DS}$ (and FIG. 9). This intensity-independence implies that the photoinduced electron transfer efficiency from R chiral MBA$_2$CuCl$_4$ to SWCNTs is similarly intensity-independent over this range of light intensities. The average $g_{res}$ of devices of S and R chiral MBA$_2$CuCl$_4$/SWCNT heterojunction are about −0.194 and +0.21, respectively (see FIG. 8G) and a high $g_{res}$ of R chiral MBA$_2$CuCl$_4$/SWCNT heterojunction device is up to 0.25 (see FIG. 10). In contrast, the $g_{res}$ value of 0.0047 for the (rac-MBA)$_2$CuCl$_4$/SWCNT heterojunction indicates a negligible ability for this heterojunction to discriminate between RCP and LCP photons, in agreement with the negligible CD (see FIG. 4B). The SWCNT heterojunction approach results in large $g_{res}$ values and µA currents at low operating voltages of $V_{GS}$=0 V and $V_{DS}$=2 V (down to 0.01 V for 25 nm thick heterojunctions, vide infra), and should be applicable to a broad range of MHS (chiral organic/inorganic metal-halide semiconductors) with varying dimensionality and degrees of intrinsic conductivity.

Interestingly, the calculated value of $g_{res}$ is 4-5 times higher than the $g_{CD}$ value calculated from CD and absorption spectra, where $g_{CD}$ factors for R- and S-MBA$_2$CuCl$_4$/SWCNT heterojunctions at 405 nm are 0.005 and −0.004, respectively. In a heterojunction active layer such as the ones explored here, the amplification of the absorption anisotropy factor for the chiral absorber layer can arise from two potential sources. First, it is possible that exciton and/or charge carrier diffusion within the chiral absorber layer is spin-selective via the chiral-induced spin selectivity (CISS). In this case, the original anisotropy factor realized by the circular dichroic absorption process could be amplified as excitons or charges move site-to-site (e.g. by hopping or resonance energy transfer) with a spin-dependent efficiency towards the interface with the charge acceptor. Second, it is possible that the interfacial charge transfer efficiency from the chiral absorber layer to the charge acceptor occurs with spin-dependent efficiency. In this case, the original absorption-based anisotropy is amplified by the spin-selective interfacial charge transfer event. Both of these spin-filtering events represent manifestations of the CISS effect, which is hypothesized to arise from the coupling between the magnetic moment of an electron and the effective magnetic field generated by electron propagation through a chiral potential.

Figure 11A:
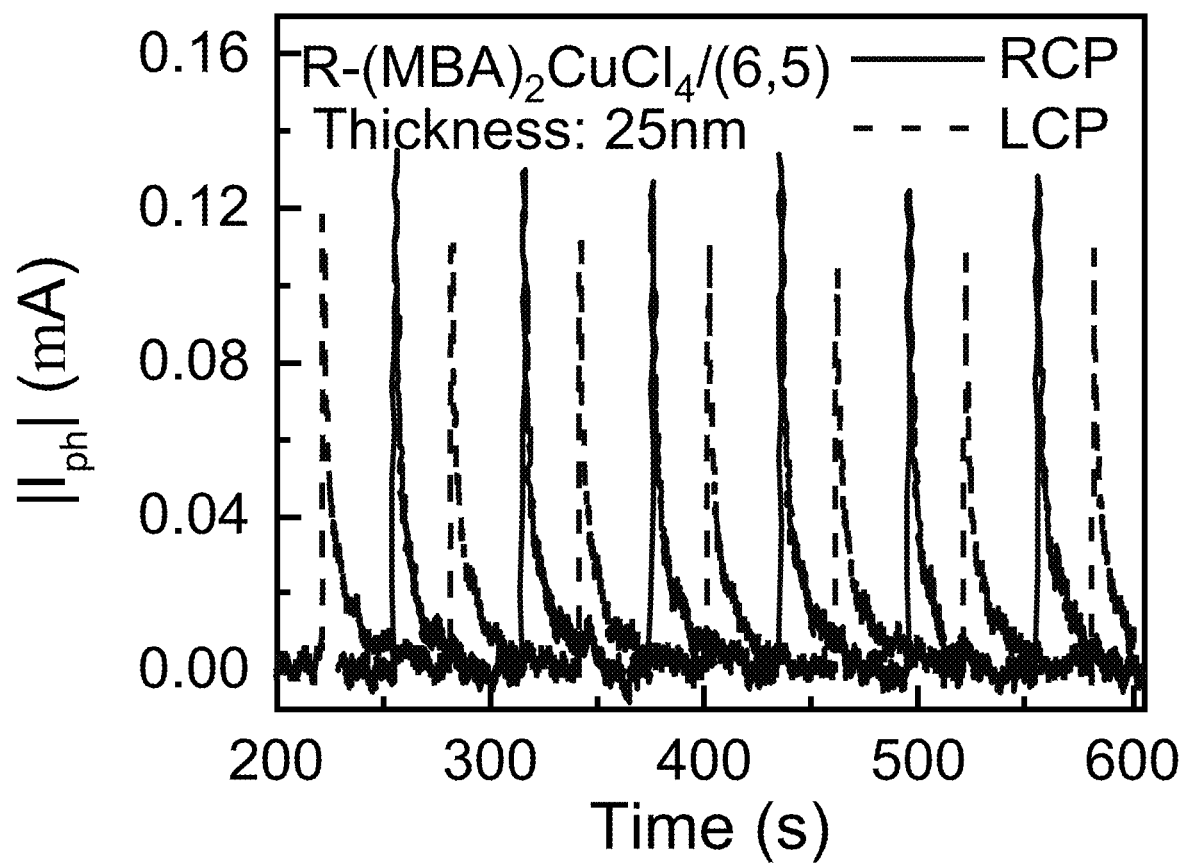
FIGS. 11A and 11B illustrate thickness-dependent CPL detection of R-MBA$_2$CuCl$_4$/(6,5) SWCNT heterojunctions, specifically the time-dependent absolute value of photocurrent change (|I$_{ph}$|) of 25 nm (V$_{DS}$=0.01V) (FIG. 11A) and 100 nm (V$_{DS}$=1V) (FIG. 11B) thick (R-MBA)$_2$CuCl$_4$/SWCNT heterojunctions, separately, according to some embodiments of the present disclosure.
Figure 11B:
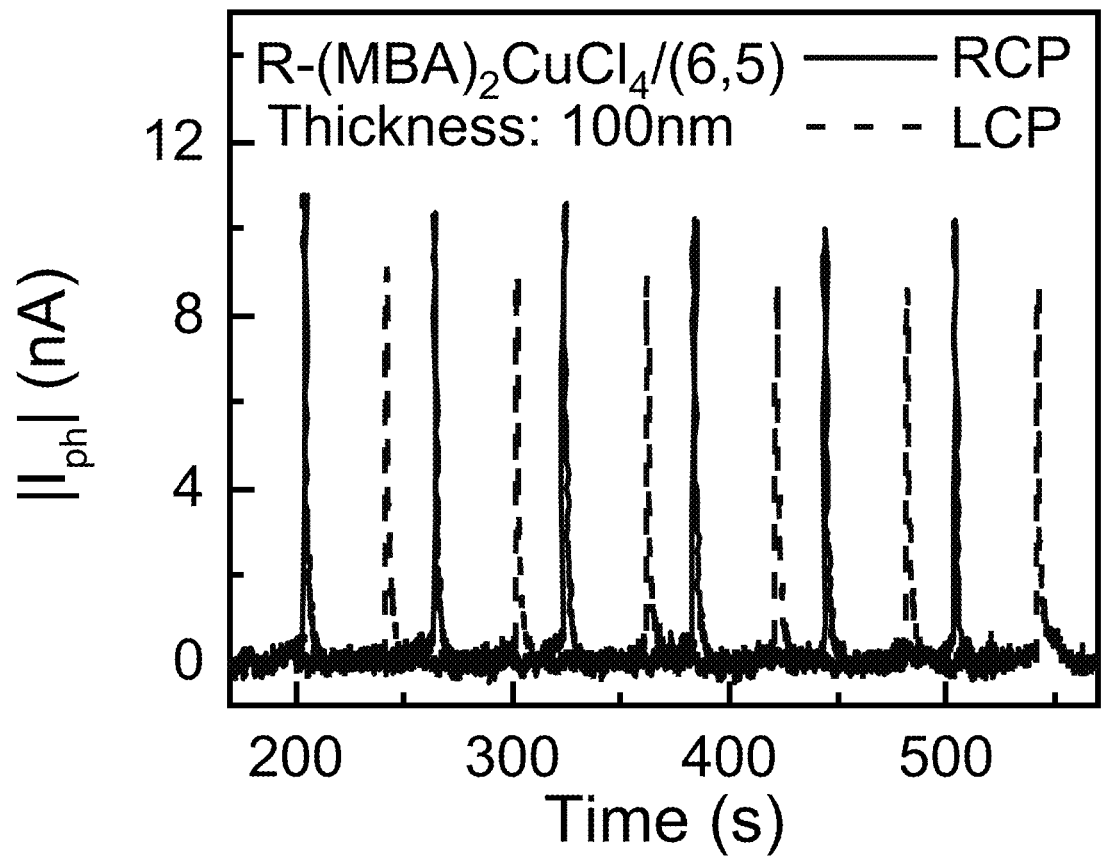
Figure 11C:
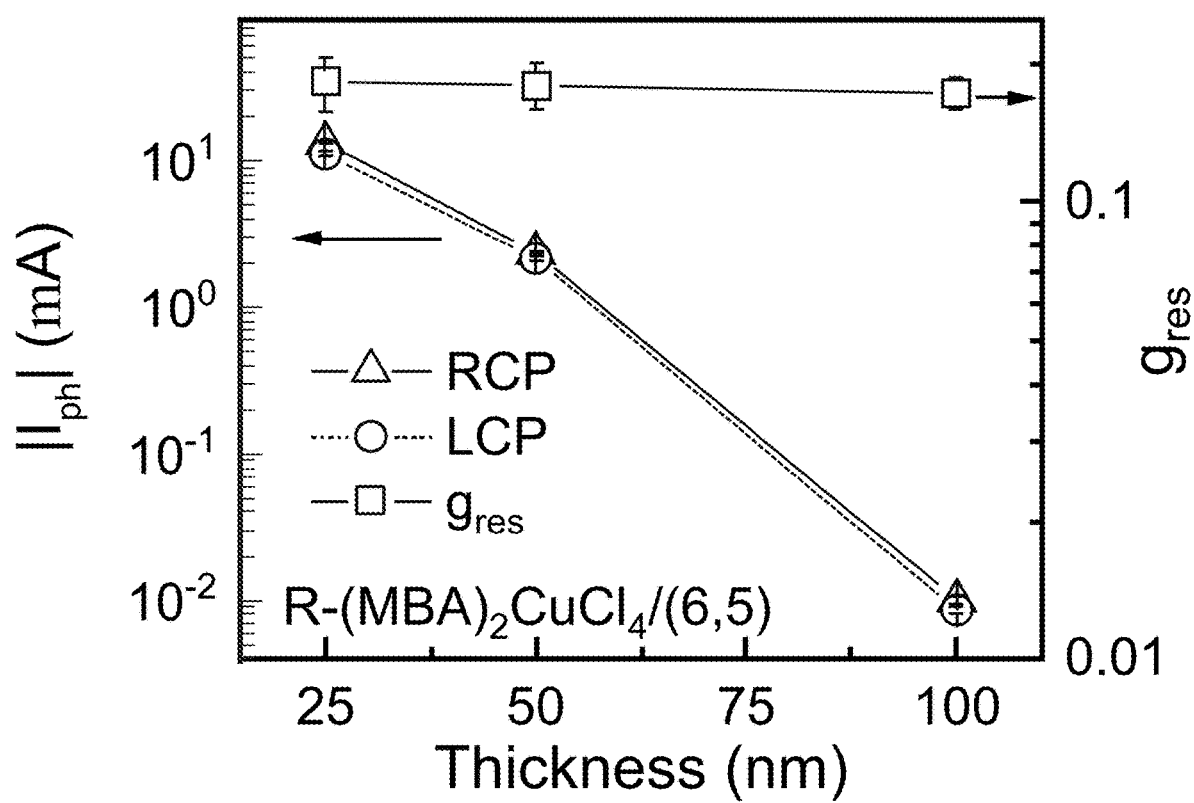
FIG. 11C illustrates |I$_{ph}$| and $g_{res}$ as a function of thickness of (R-MBA)$_2$CuCl$_4$/SWCNT heterojunctions, according to some embodiments of the present disclosure.

To probe the relevant contributions of spin-selective transport within the MBA$_2$CuCl$_4$ absorber layer and/or spin-selective interfacial charge transfer at the MBA$_2$CuCl$_4$/SWCNT interface, a thickness-dependent study was completed. Here, three different thickness (15 nm, 40 nm, and 90 nm) of the R-chiral MBA$_2$CuCl$_4$ layer were deposited on the top surface of an identically prepared ~10 nm thick SWCNT networks, so the total heterojunction thicknesses were 25 nm, 50 nm, and 100 nm, respectively. The time-dependent $|I_{ph}|$ of 25 nm and 100 nm thickness devices are plotted in FIGS. 11A and 11B (405 nm, 1 s pulse duration, and 60 s period), while FIG. 11C plots the thickness dependent $I_{ph}$ and $g_{res}$. The photocurrent magnitude drops off dramatically with increasing thickness, with the 25 nm thick heterojunction showing almost 3 orders of magnitude higher $|I_{ph}|$ than that of the 100 nm thickness device. Note that the large $|I_{ph}|$ for the 25 nm device was measured with a very low operating voltage of $V_{DS}$=0.01 V. Despite the substantial decline in $|I_{ph}|$ with increasing thickness, there is only a small decline in $g_{res}$ (see FIG. 11C). The calculated $g_{res}$ values for the 25 nm, 50 nm, and 100 nm thickness heterojunctions are ca. 0.183, 0.18, and 0.173, respectively. The drop-off of $|I_{ph}|$ and relatively constant magnitude of $g_{res}$ with increasing MBA$_2$CuCl$_4$ thickness suggests that spin-selective interfacial charge transfer is the dominant mechanism resulting in amplification of the helicity-dependent anisotropy in these heterojunctions. This result is sensible, given the lack of connectivity between the isolated CuCl$_4$ tetrahedra, which leads to inefficient charge/exciton transport within the MBA$_2$CuCl$_4$ absorber layer. As such, these heterojunctions rely predominantly upon spin-selective interfacial photoinduced electron transfer at the donor/acceptor interface to enable both high photocurrent and a high CPL anisotropy factor.

Experimental Methods:

Materials. All chemicals were used as received unless otherwise indicated. Phenethylamine (PEA), (R)-(+)-α-methylbenzylamine (R-MBA, 98%, ee 96%), (S)-(−)-α-methylbenzylamine, (S-MBA, 98%, ee 98%), (±)-α-methylbenzylamine (rac-MBA, 99%), copper (II) chloride dihydrate (CuCl$_2$.2H$_2$O, 99.999%), hydrochloric acid (ACS reagent, 37% wt % in water), N,N-anhydrous DMF were purchased from Sigma-Aldrich.

Synthesis of phenethylammonium chloride (PEACl). 5 mL of phenethylamine (PEA) and 15 mL of ethanol were added to a 250 mL round bottom flask. The mixture was stirred at 0° C. using an ice-water bath, followed by adding 10 mL of HCl (37% wt % in water) dropwise. The solution was stirred for 2 hours. Subsequently, the solvent was removed by a rotatory evaporator. The white powder was then recrystallized from ethanol/diethyl ether, generating phenethylammonium chloride (PEACl).

Synthesis of methylbenzylammonium chloride (MBACl). The synthesis of MBACl is similar to that of PEACl. Briefly, 5 mL of methylbenzylamine (R-/S-/rac-MBA) and 15 mL of ethanol were added to a 250 mL round bottom flask. The mixture was stirred at 0° C. using an ice-water bath. 10 mL of HCl (37% wt % in water) was then added to the mixture dropwise. The solution was stirred for 2 hours. Subsequently, the solvent was removed by a rotatory evaporator. The white powder was then recrystallized from of mixture of ethanol/diethyl ether, generating methylbenzylammonium chloride (MBACl).

Synthesis of PEA$_2$CuCl$_4$ single crystals. 171 mg of CuCl$_2$.2H$_2$O (1 mmol), 315 mg of PEACl (2 mmol) and 6 mL of methanol were loaded in a glass vial. The mixture was then stirred under heat until all solids were dissolved, yielding a clear dark green solution. The vial was then allowed to cool to room temperature, and dark-yellow plate-like crystals (PEA$_2$CuCl$_4$) were precipitated out of the solution. These crystals were then filtered, washed by diethyl ether and dried in vacuum overnight.

Synthesis of (R-/S-/rac-MBA)$_2$CuCl$_4$ single crystals. The synthesis of MBA$_2$CuCl$_4$ is very similar to that of PEA$_2$CuCl$_4$. 171 mg of CuCl$_2$.2H$_2$O (1 mmol), 315 mg of MBACl (2 mmol) and 2 mL of isopropanol were loaded in a glass vial. The mixture was then stirred under heat until all solids were dissolved, yielding a clear dark green solution. The vial was then allowed to cool to room temperature, and green plate-like crystals (MBA$_2$CuCl$_4$) were precipitated out of the solution. These crystals were then filtered, washed by diethyl ether and dried in vacuum overnight. Larger MBA$_2$CuCl$_4$ crystals (1 cm×1 cm) can be grown by slowly diffusing diethyl ether into a methanol solution of MBA$_2$CuCl$_4$.

Preparation of PEA$_2$CuCl$_4$ and (R-/S-frac-MBA)$_2$CuCl$_4$ thin films. Glass or quartz substrates were washed sequentially using acetone and isopropanol in a sonicator for 100 min each, followed by an ultraviolet-ozone treatment for 15 min. Precursor solutions were prepared by dissolving crystals in DMF with a mass-to-volume ratio of 10 wt % (e.g. 20 mg in 200 μL). Thin films were prepared by spin coating the corresponding precursor solution onto substrates using a spin rate of 4000 rpm for 30 s, followed by thermal annealing at 100° C. for 10 min. Thin films on glass substrates were used for XRD measurements. Thin films on quartz substrates were used for linear optical and CD measurements.

Single crystal X-ray diffraction. Single crystal full-sphere data were collected using a Bruker KAPPA APEX II diffractometer equipped with an APEX II CCD detector using a TRIUMPH monochromator with Mo Kα source ($\lambda$=0.71073 Å) with MX Optics or a Bruker D8 VENTURE diffractometer equipped with a Kappa goniometer stage, a PHOTON II CPAD detector, and an IμS 3.0 Mo Kα source ($\lambda$=0.71073 Å). Data were collected at 293 K. The collected data were integrated and applied with multiscan absorption correction using the APEX2 or APEX3 software. Structure solution was obtained by direct methods using the SHELXS program and refined using the least-squares method by employing the SHELXL program within the Olex2 software[37].

Linear optical absorption measurements. For powder absorption, powder samples were first obtained by grinding single crystals using mortar pestle. Linear optical absorption spectra were obtained by performing optical diffuse reflectance measurements in a Cary 5000 UV-vis-NIR spectrometer operating in the 1500-300 nm region at room temperature. $BaSO_4$ was used as the reference for 100% reflectance, and $BaSO_4$ was also used to dilute powder samples for all measurements. Linear optical absorption spectra of powders were generated by converting reflectance to absorption data using the Kubelka-Munk equation: $a/S=(1-R)^2/(2R)$, where R is the reflectance and a and S are the absorption and scattering coefficients, respectively. For thin film absorption, absorption spectra were collected in the transmission mode using a quart substrate as the reference of 100% reflectance.

CD measurements. CD measurements were performed using Jasco J-715 spectropolarimeter with the thin film placed in the beam path. The spectra obtained were averages of 3-5 scans. The CD spectra were collected in 200-600 nm range with 0.2 nm resolution.

Transient absorption measurements. Transient absorption measurements were performed using a Coherent Libra Ti:sapphire laser, with an output of 800 nm at 1 kHz. The 800 nm beam was directed into a TOPAS optical parametric amplifier to generate pump pulse (~150 fs) and was modulated at 500 Hz through an optical chopper to block every other laser pulse. Femtosecond TA spectra were collected using the Helios spectrometer (Ultrafast Systems). A small amount of 800 nm light was used to pump a 1 cm thick sapphire crystal to generate 750-1500 nm probe light for NIR TA. All samples are prepared under $N_2$ atmosphere and measured using air-free holders.

Preparation of polymer and s-SWCNT dispersion. SWCNT dispersions and inks were prepared as previously reported.[33] The SWCNT raw material was the CoMoCAT SG65i material, and was commercially obtained from Chasm. The polymer used in this study was poly [(9,9-dioctylfluorenyl-2, 7-diyl)-alt-co-(6,6'-[2,2'-bipyridine])] (PFO-BPy), and was purchased from American Dye Source. When used to disperse the CoMoCAT SG65i material, PFO-BPy preferentially disperses the (6,5) semiconducting SWCNT and lowers the metallic SWNT purity level down to less than 1% in SWCNT dispersion. To prepare the SWCNT/polymer mixture, 7.5 mg of the SWCNT material and 30 mg of PFO-BPy are loaded into 15 mL of toluene. This dispersion was sonicated by using a tip sonicator (Cole-Parmer CPX 750) for 30 min, with a half-inch diameter tip at 40% power. After this initial sonication step, the dispersion was centrifuged for five minutes on a Beckman optima™ L-100XP ultracentrifuge in an SW32 rotor at a centrifugal force of 132,000×g. The (6,5)-enriched supernatant was collected by pipette and the remaining solid pellet was discarded. After collecting multiple (6,5) dispersions (6-10), the majority of the excess PFO-BPy polymer was removed through three continuous 20-hr ultracentrifuge runs at a centrifugal force of 241,000×g. After each 20-hr centrifuge run, the polymer-rich supernatant was decanted and discarded, while the (6,5)-enriched SWCNT pellet was collected and re-dispersed into toluene. After the end of the third polymer removal run, the SWNT pellet was re-dispersed in toluene for further spray-coating.

Preparation of s-SWNT networks. s-SWCNT networks are prepared by spraying the prepared s-SWCNT inks onto $SiO_2/Si$ wafers or quartz substrates using the ultrasonic sprayer with a Sonotek 120 kHz impact nozzle at room temperature.[33] Before deposition, the substrates were rinsed by acetone and isopropyl alcohol (IPA) and treated by $O_3$ plasma for 10 mins. The SWCNT dispersion was delivered to the ultrasonic nozzle using a syringe pump at 300 μL/min, and a nitrogen jet (7 std L/min) deflected the atomized ink to the substrate. The power delivered to the nozzle was 0.8 W. The substrate was heated up to 130° C. to vaporize the toluene solvent as the ink droplets impinged upon the substrate. After spray coating, the s-SWCNT thin film was soaked in a 78° C. toluene bath for 10 min to remove excess fluorene-based polymers.

Preparation of $MBA_2CuCl_4$/SWCNT heterojunction. Different $MBA_2CuCl_4$/DMF solutions with various concentrations (5 wt %, 10 wt %, and 20 wt %) were first prepared. The $MBA_2CuCl_4$/DMF was then spin-coated on top of the patterned SWCNT network using a spin rate of 4000 rpm for 30 s, followed by thermal annealing at 100° C. for 10 min.

Device Fabrication. The typical FET device was fabricated on the 200 nm thickness $SiO_2$/highly doped p-type Si wafer (1-10 $\Omega cm^{-1}$) purchased from MTI corporation by using the standard optical lithography technique. Gold electrodes with a titanium adhesion layer (5 nm thickness Ti/20 nm thickness Au) were deposited on the patterned substrate by using the thermal evaporation deposition system, and the gate electrode was directly contacted with highly doped Si wafer. All of these procedures were performed in the cleanroom. As designed, the channel length ($L_{ch}$) of the devices used in this study were ca. 10 μm and the channel width ($W_{ch}$) is ca. 1000 μm.

Photocurrent response measurement. All photocurrent measurements were performed inside a nitrogen atmosphere glove box with 3 mbar pressure. This type of measurement was conducted using two Keithley 2400 source meters: one was used to supply the power to the laser diode, the other was used to supply the voltage to devices and monitor the channel current. All the experimental parameters and data were controlled and collected by a self-developed LabVIEW program. The 405 nm laser illumination was supplied by using KOKUYO laser diodes, and the linear polarizer and 405 nm quarter wave plate were purchased from Thorlabs Inc. The power density of the laser diode was adjusted by inserting a series of neutral density filters between the quarter wave plate and the device, these neutral density filters were also purchased from Thorlabs Inc. And the power of the laser was calibrated by using a Field Mate laser power meter from Coherent Inc. The pulse-mode laser signal was generated by using an Agilent 33220A function generator with controlled software to power the laser diode, and the energy of the pulse-mode laser was calibrated by using Ophir Laserstar P/N 7021600 power meter with a lower limit of detection of 1 pW.

The foregoing discussion and examples have been presented for purposes of illustration and description. The foregoing is not intended to limit the aspects, embodiments, or configurations to the form or forms disclosed herein. In the foregoing Detailed Description, for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A composition comprising:
    a first layer comprising a first molecule comprising a metal and a halogen;
    a second layer comprising the first molecule;
    a third layer comprising at least one of R-methylbenzylammonium or S-methylbenzylammonium; and
    a layer comprising a carbon nanotube (CNT), wherein:
    the third layer is positioned between the first layer and the second layer,
    the first layer, the second layer, and the third layer form a crystalline structure,
    the layer comprising a CNT is in contact with the first layer or the second layer,
    the composition can detect circularly polarized light (CPL), and
    the CPL has an average anisotropic factor of circular dichroism ($g_{CD}$) between 0.001 and 0.2 in a wavelength range between 200 nm and 470 nm.

2. The composition of claim 1, wherein the metal comprises copper.

3. The composition of claim 1, wherein the halogen comprises chloride.

4. The composition of claim 1, wherein the first molecule comprises $CuCl_4$.

5. The composition of claim 1, wherein the crystalline structure has a shape comprising a platelet.

6. The composition of claim 5, wherein the platelet is substantially planar in shape.

7. The composition of claim 1, wherein the CNT comprises a single-walled carbon nanotube (SWCNT).

8. The composition of claim 1, wherein the SWCNT comprises a (6,5) semiconducting SWCNT.

9. The composition of claim 1, further comprising an average anisotropic factor of photoresponsivity ($g_{res}$) between −0.194 and +0.25.

10. The composition of claim 1, wherein the layer comprising a CNT is capable of performing as a contact layer.

11. The composition of claim 1, wherein the first layer, the second layer, and the third layer have a combined thickness between 10 nm and 200 nm.

12. The composition of claim 11, wherein the combined thickness is between 10 nm and 100 nm.

13. The composition of claim 1, wherein at least one of the first layer or the second layer is constructed of two or more layers.

14. The composition of claim 13, wherein each of the two or more layers has a thickness between 1 nm and 2 nm.

15. A device comprising:
    an absorber layer comprising:
        a first layer comprising a first molecule comprising a metal and a halogen;
        a second layer comprising the first molecule; and
        a third layer comprising at least one of R-methylbenzylammonium or S-methylbenzylammonium, wherein:
        the third layer is positioned between the first layer and the second layer, and
        the first layer, the second layer, and the third layer form a crystalline structure; and
    a transport layer comprising a carbon nanotube (CNT), wherein:
    the transport layer comprising the CNT is in contact with the first layer or the second layer,
    the device is capable of detecting circularly polarized light (CPL), and
    the CPL has an average anisotropic factor of circular dichroism ($g_{CD}$) between 0.001 and 0.2 in a wavelength range between 200 nm and 470 nm.

16. The device of claim 15, configured to operate as at least one of an optical device, an imaging device, a sensing device, a computing device, an information processing device, or a communication device.

* * * * *